US007511547B2

(12) United States Patent
Suda et al.

(10) Patent No.: US 7,511,547 B2
(45) Date of Patent: Mar. 31, 2009

(54) DELAY CIRCUIT, AND TESTING APPARATUS

(75) Inventors: Masakatsu Suda, Tokyo (JP); Shusuke Kantake, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/446,855

(22) Filed: Jun. 5, 2006

(65) Prior Publication Data

US 2006/0267656 A1 Nov. 30, 2006

Related U.S. Application Data

(63) Continuation of application No. PCT/JP2004/018943, filed on Dec. 17, 2004.

(30) Foreign Application Priority Data

Dec. 18, 2003 (JP) ............................. 2003-421617

(51) Int. Cl.
*H03H 11/26* (2006.01)
(52) U.S. Cl. ...................................... 327/276; 327/278
(58) Field of Classification Search ......... 327/276–278, 327/108, 538

See application file for complete search history.

(56) References Cited

U.S. PATENT DOCUMENTS

| 5,995,441 | A | 11/1999 | Kato et al. | |
|---|---|---|---|---|
| 6,178,123 | B1 * | 1/2001 | Kato et al. | 365/194 |
| 6,651,179 | B1 * | 11/2003 | Sato et al. | 713/401 |
| 2002/0067215 | A1 * | 6/2002 | Takenaka et al. | 331/57 |
| 2003/0217341 | A1 * | 11/2003 | Rajsuman et al. | 716/4 |

(Continued)

FOREIGN PATENT DOCUMENTS

JP 5-145382 6/1993

(Continued)

OTHER PUBLICATIONS

International Search Report issued for International application No. PCT/JP2004/018943 mailed on Jan. 25, 2005 and English translation thereof, 6 pages.

(Continued)

*Primary Examiner*—Long Nguyen
*Assistant Examiner*—Ryan C Jager
(74) *Attorney, Agent, or Firm*—Osha • Liang LLP

(57) ABSTRACT

A delay circuit for delaying an input signal according to a desired delay time setting and outputting the same is provided. The delay circuit includes: a delay element for delaying the input signal for a delay time based on a given supply current and outputting the same; a current supply section for generating a supply current; a voltage generating section for generating a base voltage dependent on a delay time setting; and a control section for converting a base voltage to a control voltage dependent on the characteristic of the current supply section and providing the same to the current supply section in order to cause the current supply section to generate the supply current. The current supply section may have a predetermined conductivity and include a first MOS transistor for applying a drain current to the delay element as the supply current. The control section may generate a first control voltage to operate a first MOS transistor in a saturation region and provide the same to a gate terminal of the first MOS transistor.

27 Claims, 13 Drawing Sheets

U.S. PATENT DOCUMENTS

2004/0164780 A1* 8/2004 Owens et al. ............... 327/276
2004/0247066 A1* 12/2004 Suda .......................... 375/376
2005/0001648 A1* 1/2005 Yamamoto ................. 324/772

FOREIGN PATENT DOCUMENTS

| JP | 11-306757 | 11/1999 |
|----|-----------|---------|
| JP | 2001-28195 | 1/2001 |
| JP | 2003-17988 | 1/2003 |

OTHER PUBLICATIONS

First Office Action Notification issued in Chinese Application No. 200480037677.7 dated Nov. 28, 2008 and English translation thereof, 17 pages.

* cited by examiner

DELAY CIRCUIT, AND TESTING APPARATUS

CROSS REFERENCE TO RELATED APPLICATION

This is a continuation application of PCT/JP2004/018943 filed on Dec. 17, 2004 which claims priority from a Japanese Patent Application(s) No. 2003-421617 filed on Dec. 18, 2003, the contents of which are incorporated herein by reference.

BACKGROUND OF THE INVENTION

1. Field of the Invention

The present invention relates to a delay circuit for delaying an input signal for a desired period, a timing generator for generating a desired timing and a testing apparatus for testing an electronic device. Particularly, the present invention relates to a delay circuit with a small circuit in which the amount of variable delay is small and a linearizing memory is not required. The present application relates to and claims priority from a Japanese Patent Application No. 2003-421617 filed in Japan on Dec. 18, 2003, the contents of which are incorporated herein by reference for all purpose if applicable in the designated state.

2. Related Art

Conventionally, a testing apparatus for testing an electronic device such as a semiconductor device provides a signal to the semiconductor device at a desired timing. For example, the testing apparatus includes a timing generator for generating a timing signal to define the timing.

FIG. 11 shows an example of a configuration of a timing generator included in the conventional testing apparatus. The timing generator 300 includes a counter 310, a timing memory 312, an exclusive OR circuit 314, an AND circuit 316, a linearizing memory 318 and a variable delay circuit 320.

The counter 310, the exclusive OR circuit 314 and the AND circuit 316 generate a delay being an integral multiple of a received reference clock (Ref Clk). That is to say, the counter 310 receives the Ref Clk and outputs the value obtained by counting the pulse number of the Ref Clk. The timing memory 312 receives a timing set signal TS indicative of the timing of a timing signal which should be generated by the timing generator 300 and outputs a control signal dependent on the high-order bit of the timing set signal to the exclusive OR circuit 314.

For example, the timing set signal may be data indicative of the amount of delay for delaying the Ref Clk. The timing memory 312 outputs a quotient obtained by dividing the amount of delay by the cycle of the Ref Clk to the exclusive OR circuit 314. When the counted value provided from the counter 310 is corresponded to the value provided from the timing memory 312, the exclusive OR circuit 314 outputs 'H' logic signal. Then, the AND circuit 316 outputs a logical product of the signal received from the exclusive OR circuit 314 and the Ref Clk.

The timing memory 312 outputs a control signal dependent on the low-order bit of a timing set signal to the linearizing memory 318. For example, the timing memory 312 provides delay setting data corresponding to a remainder obtained by dividing the amount of delay indicated by the timing signal by the cycle of the Ref Clk to the linearizing memory 318.

The linearizing memory 318 controls the amount of delay in the variable delay circuit 320 based on the received delay setting data. The variable delay circuit 320 delays the signal outputted from the AND circuit 316 and externally outputs the delayed signal as a timing signal.

The linearizing memory 318 stores control data corresponding to a linearization of the delay setting data in a micro-variable delay circuit 320.

FIG. 12 shows a configuration of the conventional variable delay circuit 320. The variable delay circuit 320 includes a plurality of buffers 324, a multiplexer 322 and a micro-delay section 330. The plurality of buffers 324 are connected in series and delays sequentially the signals outputted from the AND circuit 316. The multiplexer 322 selects the signal outputted from any of the buffers 324 based on the control data received from the linearizing memory 318 and outputs the same to the micro-delay section 330. Thereby the variable delay circuit 320 generates a delay being the integral multiple of the amount of delay in the buffer 324.

The micro-delay section 330 generates a delay of which delay step is less than that in the buffer 324 and of which maximum delay is approximately equal to the delay for one step of the buffer 324. At this time, it is preferred that the amount of maximum delay of the micro-delay section 330 is designed redundantly for the delay for one step of the buffer 324 in order to absorb such as production tolerance. The micro-delay section 330 may include a buffer 326 and a variable capacity 328 and generates a desired micro-delay by changing the capacity of the variable capacity according to the control data.

The delay time in the conventional delay section 330 is defined based on a current to charge/discharge the variable capacity 328 by the buffer 326 and the capacity of the variable capacity 328. Here, the charge/discharge current and the capacity are fluctuated due to process tolerance and the fluctuation of voltage and temperature. Therefore, any error of the amount of delay is generated in the micro-delay section 330.

FIG. 13 shows the amount of delay in the micro-delay section 330 for the control data provided from the linearizing memory 318 to the micro-delay section 330. Thereby the amount of delay in the micro-delay section 330 is fluctuated by 0.6-1.5 times as large as the typical value. In this case, the ratio between the maximum value and the minimum value of the fluctuation of the amount of delay becomes about 2-3 times and it is unable to disregard to fluctuation of the amount of delay.

As for the fluctuation of the amount of delay, the amount of delay in the micro-delay section 330 is actually measured for each value of the process, the voltage and the temperature and stores the delay setting data and the control data in the linearizing memory 318 in association with each other such that the delay setting data provided to the linearizing memory 318 and the actual amount of delay is equal. However, the bit number of the control data stored in the linearizing memory 318 is increased by several bit than the delay setting data because the ratio between the maximum value and the minimum value of the fluctuation of the amount of delay is about 2-3 times as described above. Therefore, the linearizing memory 318 needs to store more data to compensate to the fluctuation of the process tolerance, the voltage and the temperature.

For example, when a period of Ref Clk is 4nS, and a delay resolution in the micro-delay section 330 is 0.98 ps (=4nS/ 2^12), the address of the linearizing memory 318 is 12 bit (4096 word) while the bit number of the control data is increased to about 15 bit in order to compensate the fluctuation. That is to say, the linearizing memory 318 needs a storage area about 4096w×15 bit and occupies a majority of the circuit in the timing generator 300.

Thus, an object of the present invention is to provide a delay circuit and a testing apparatus being capable of solving the problem accompanying the conventional art. This object is achieved by combining the features recited in independent claims. Then, dependent claims define further effective specific example of the present invention.

SUMMARY OF THE INVENTION

In order to solve the above-described problem, a first aspect of the present invention provides a delay circuit for delaying an input signal according to a desired delay time setting and outputting the same. The delay circuit includes: a delay element for delaying an input signal for a delay time based on the given supply current and outputting the same; a current supply section for generating a supply current; a voltage generating section for generating a base current according to the delay time setting; and a control section for converting a base voltage to a control voltage based on the characteristic of the current supply section and applying the same to the current supply section in order to cause the current supply section to generate a supply current.

The current supply section has a predetermined conductivity and includes a first MOS transistor for providing a drain current to the delay element as the supply current. The control section generates a first control voltage to operate a first MOS transistor in a saturation region and provides the same to the gate terminal of the first MOS transistor.

The control section includes a third MOS transistor for controlling the magnitude of the control current generated by the control section based on the base current. The control section may generate a first control voltage based on the control current.

The delay element may be an inverter for delaying an input signal and outputting the same by charging/discharging the output capacity according to the input signal. The first MOS transistor may provide a charging current to charge the output capacity of the inverter. The current supply section may further include a second MOS transistor for providing a discharging current to discharge the output capacity of the inverter to the inverter. The control section may generate a second control voltage to operate the second MOS transistor in the saturation region based on the control current and provide the same to a gate terminal of the second MOS transistor.

The first MOS transistor may be a p-channel MOS transistor. The second MOS transistor may be a n-channel MOS transistor. The first MOS transistor and the second MOS transistor of which drain current may be approximately the same when the same gate voltage and the same drain voltage are applied.

The voltage generating section may include a base current source for generating a predetermined base current and a current-voltage converting section for amplifying the base current based on the delay time setting and generating a base voltage based on the amplified base current.

The current-voltage converting section may include a plurality of amount of delay converting current generating circuits for amplifying the base current at the different magnification each other, a selecting section for selecting one or more of a plurality of amount of delay converting current generating circuits and a converter for generating a base current based on the sum of the current amplified by the amount of delay converting current generating circuit selected by the selecting section.

The current-voltage converting section may further include an offset current generating circuit for generating a predetermined offset current in order to operate the first MOS transistor in the saturation region. The converter may generate the base voltage further based on the offset current.

Each of the amount of delay converting current generating circuits includes an amount of delay converting current path electrically connected to the converter and a dummy current path which is provided in parallel with the amount of delay converting current path and which is not electrically connected to the converter. The selecting section may apply the current amplified by the selected amount of delay converting current generating circuit to the amount of delay converting current path, cause the converter to provide the same and apply the current amplified by the amount of delay converting current generating circuit which is not selected to the dummy current path.

In the third MOS transistor, the control current is applied to the drain terminal, and the base voltage to regulate the control current is applied to the gate terminal. The control section may generate a first control voltage based on the potential difference between the drain terminal and the source terminal of the third MOS transistor, which is generated due to the control current.

The gate terminal of the third MOS transistor and the gate terminal of the first MOS transistor may be electrically connected each other.

The control section further include a fourth MOS transistor in which the control current is provided to the source terminal. The control section may generate a second control voltage based on the potential difference between the drain terminal and the source terminal of the fourth MOS transistor, which is generated due to the control current.

The gate terminal of the fourth MOS transistor, the drain terminal of the fourth MOS transistor and the gate terminal of the second MOS transistor may be electrically connected each other.

The fourth MOS transistor may be a p-channel MOS transistor and the third MOS transistor may be a n-channel MOS transistor.

The offset current generating circuit may operate the third MOS transistor and the fourth MOS transistor in a linear region within the delay time setting and generate an offset current enough to operate the first MOS transistor and the second MOS transistor in the saturation region.

In the third MOS transistor, the control current is applied to the drain terminal, and the base voltage to regulate the control current is applied to the gate terminal. The control section may generate the second control voltage based on the potential difference between the drain terminal and the source terminal of the third MOS transistor, which is generated due to the control current.

The second MOS transistor and the third MOS transistor may be current mirror-connected. The supply current dependent on the magnitude of the control current applied to the third MOS transistor may be applied to the second MOS transistor.

The control section may further include a fourth MOS transistor in which the control current is applied to the source terminal. The control section may generate the first control voltage based on the potential difference between the drain terminal and the source terminal of the fourth MOS transistor, which is generated due to the control current.

The first MOS transistor and the fourth MOS transistor are current mirror-connected. The supply current with the magnitude enough to the control current applied to the fourth MOS transistor may be applied to the first MOS transistor.

The fourth MOS transistor may be a p-channel MOS transistor and the third MOS transistor may be a n-channel MOS transistor.

The offset current generating circuit may generate an offset current enough to operate the first MOS transistor, the second MOS transistor, the third MOS transistor and the fourth MOS transistor in the saturation region within the delay time setting.

The base current source may generate a plurality of base currents with the different magnitude based on the resolution of the delay time setting. The current-voltage converting section may amplify each of the base current dependent on the delay time setting and generate a base voltage based on sum of the plurality of amplified base currents.

The base current source includes a first base current source for generating a first reference current source with a predetermined size, a second reference current source for generating a second reference current with magnitude being one time as large as the integer of the reference current and a plurality of base current converting section for generating base currents with the different magnitude each other based on the first reference current and the second different current. Each of the base current converting sections may include a first amplifying section for amplifying of the magnitude of the first reference current to the integral multiple, a second amplifying section for amplifying the magnification of the second reference current to the integral multiple and a reference current combining section for generating the sum of the first reference current amplified by the first amplifying section and the second reference current amplified by the second amplifying section as the base current.

The base current source may include a current source for generating a first base current with a predetermined magnitude and a current dividing section for dividing the first base current into a plurality of transistors provided in parallel and generating a second base current with the magnitude being one time as large as the integer of the first base current.

The current-voltage converting section may amplify the smallest base current among a plurality of base currents based on the delay time setting. The offset current generating circuit may amplify a plurality of base currents, respectively to generate an offset current.

The offset current generating circuit may amplify one or more base currents including the largest base current among the plurality of currents to generate the offset current. The current-voltage converting section may amplify one or more base currents including the smallest base current among the plurality of base currents among the delay time setting.

A second aspect of the present invention provides a testing apparatus for testing an electronic device. The testing apparatus includes a pattern generator for generating a test pattern to test an electronic device, an waveform shaper for shaping the test pattern and providing the same to the electronic device and a timing generator for controlling a timing at which the waveform shaper provides the test pattern to the electronic device. The timing generator includes a delay element for delaying a reference clock for a delay time based on the given supply current and outputting the same to the waveform shaper to control the timing at which the test pattern is provided, a current supply section for generating a supply current, a voltage generating section for generating the base current dependent on the delay time setting and a control section for converting the base voltage to the control voltage dependent on the characteristic of the current supply section and providing the same to the current supply section in order to cause the current supply section to generate the supply current.

Here, all necessary features of the present invention are not listed in the summary of the invention. The sub-combinations of the features may become the invention.

According to the present invention, a delay circuit being compact and capable of accurately delaying a signal can be provided.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
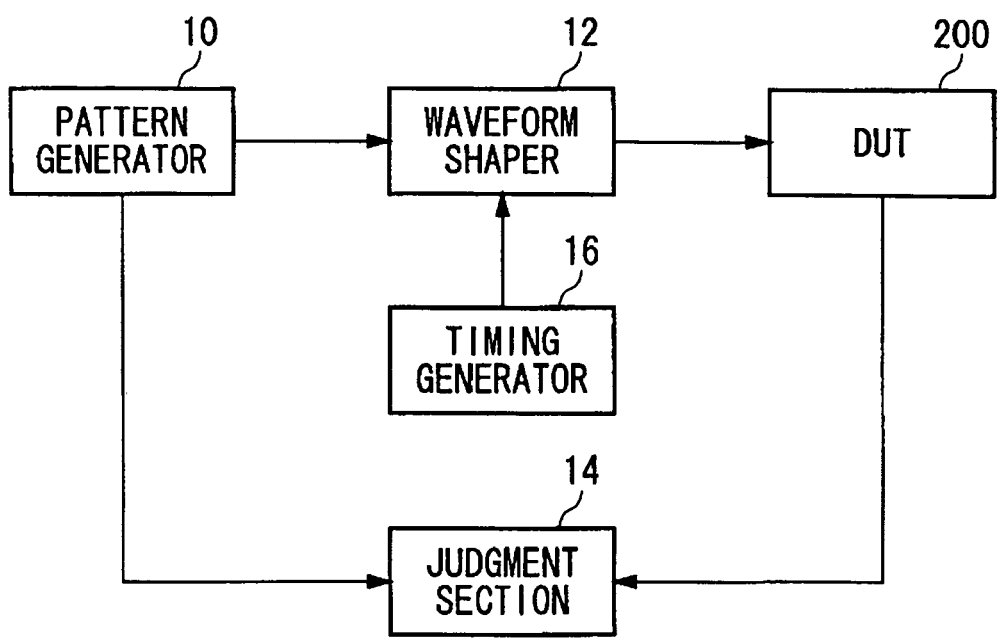
FIG. 1 shows an example of a testing apparatus 100 according to the present invention.

FIG. 1 shows an example of the configuration of the testing apparatus 100 according to the present embodiment. The testing apparatus 100 tests an electronic device 200 such as a semiconductor device, for example. The testing apparatus 100 according to the present embodiment includes a pattern generator 10, an waveform shaper 12, a timing generator 16 and judgment section 14.

The pattern generator 10 generates a test pattern to test the electronic device 200 and provides the same to the waveform shaper 12. The waveform shaper 12 receives the test pattern, shapes the same into a test signal and provides the test signal to the electronic device 200 according to the timing provided from the timing generator 16.

Figure 11:
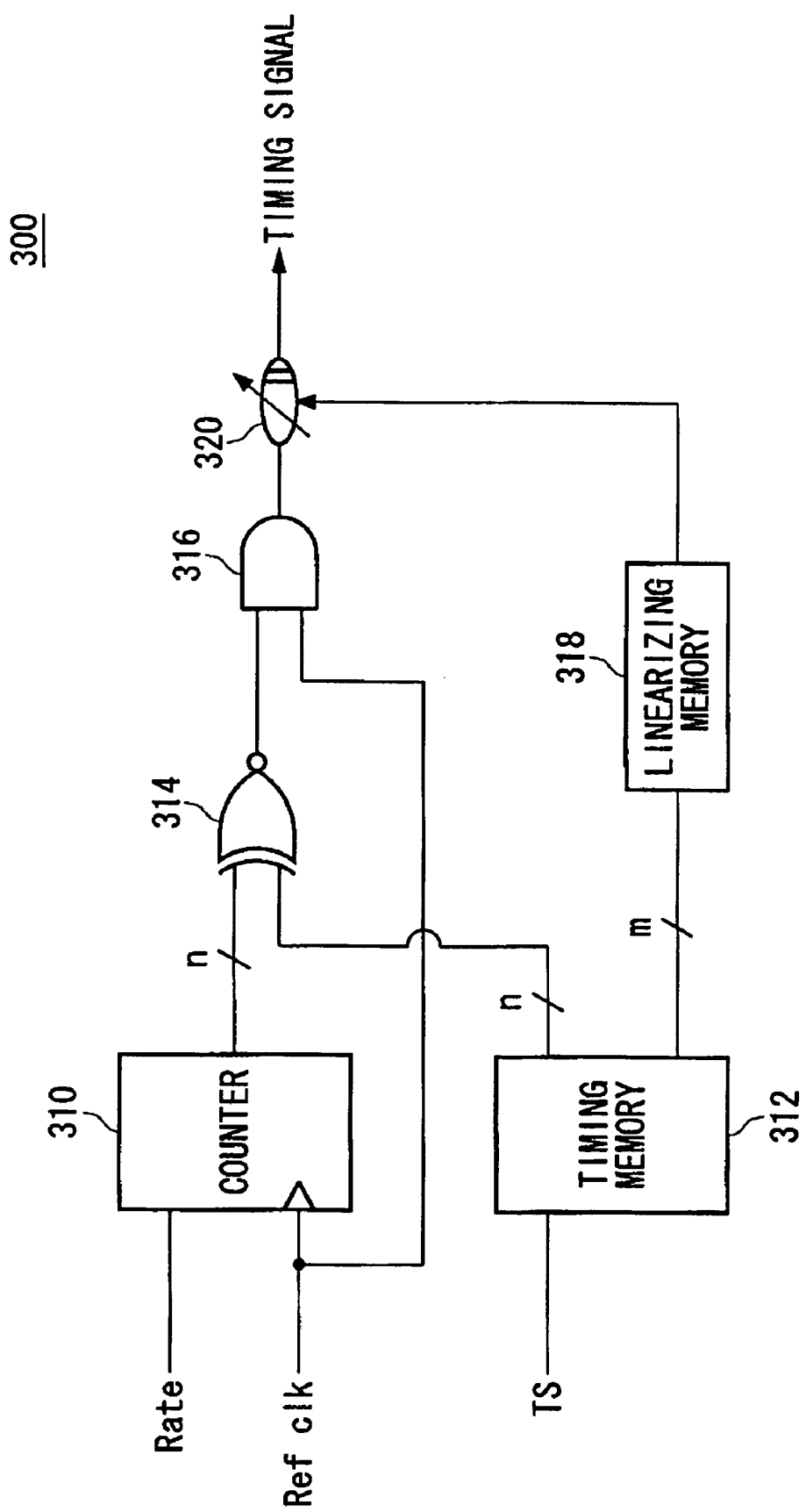
FIG. 11 shows an example of the configuration of a timing generator 300 included in the conventional testing apparatus.
Figure 12:
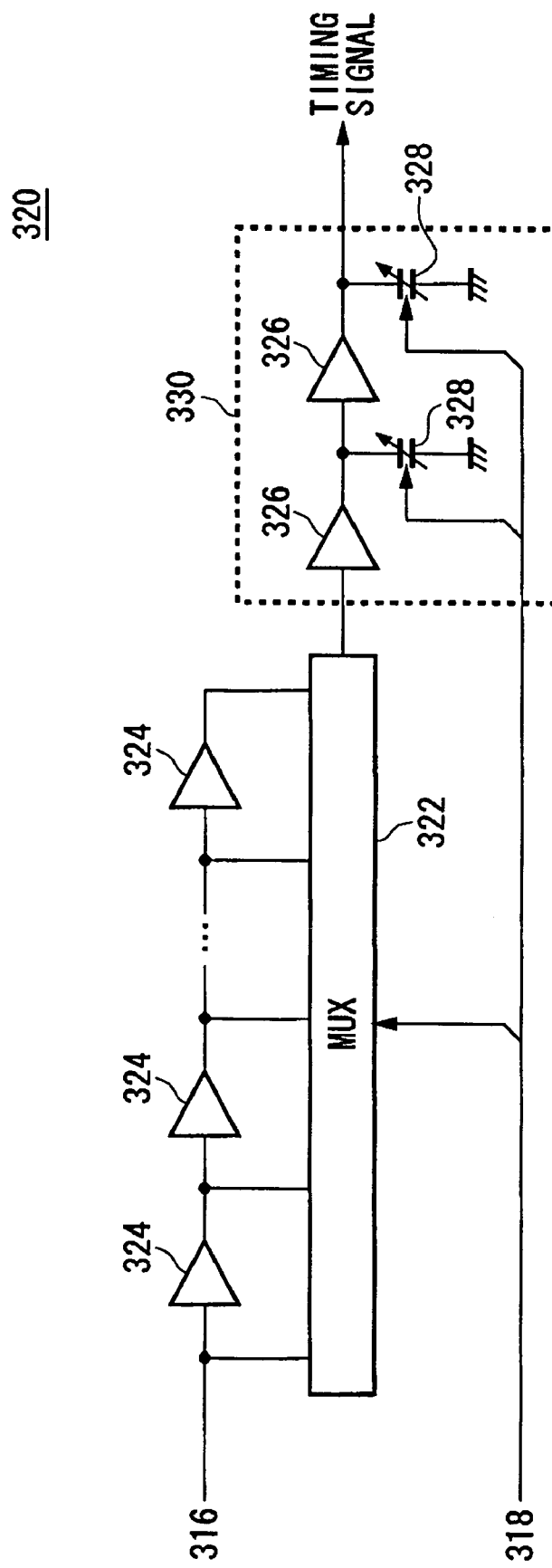
FIG. 12 shows the configuration of the conventional variable delay circuit 320.

The timing generator 16 may be a delay circuit. The timing generator 16 delays the given reference clock by a desired amount of delay and provides the same to the waveform shaper 12 to control the timing at which the waveform shaper 12 provides the test signal. The timing generator 16 may have the configuration and the function same as those of the timing generator described with reference to FIG. 11. The timing generator according to the present embodiment has a micro-variable delay circuit 20 which is described later as substitute for the micro-delay section 330 in the timing generator 300.

The judgment section 14 compares an output signal outputted according to the test signal by the electronic device with an expected value signal provided from the pattern generator 10 to judge pass/fail of the electronic device 200.

Figure 2:
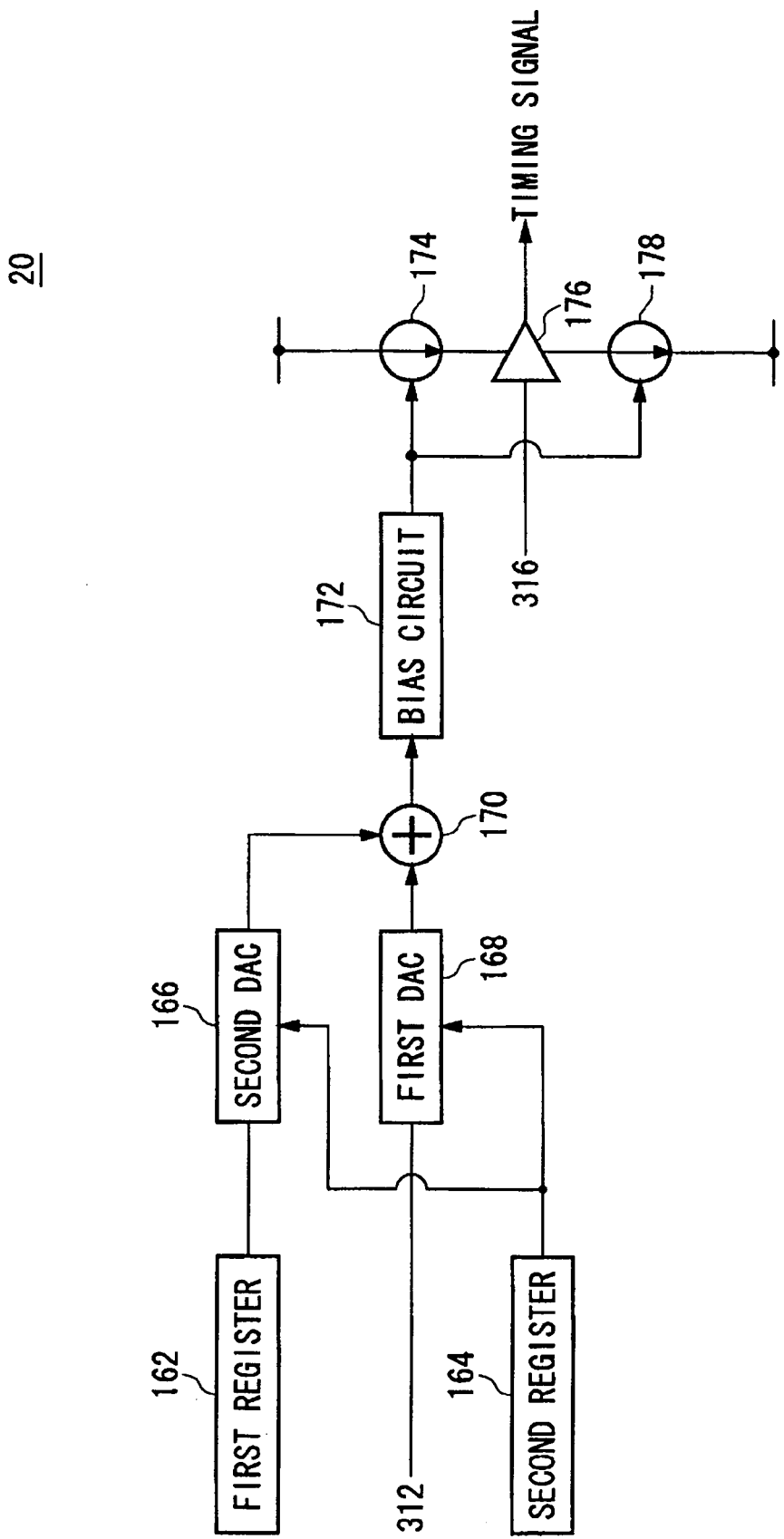
FIG. 2 shows an example of the configuration of a micro-variable delay circuit 20 included in a timing generator 16.

FIG. 2 shows an example of the configuration of the micro-variable delay circuit 20 included in the timing generator 16. The micro-variable delay circuit 20 has a first register 162, a second register 164, a first DAC 168, a second DAC 166, an adding section 170, a bias circuit 172, a buffer 176, a current sources 174 and 178. The micro-variable delay circuit according to the present embodiment generates a current proportional to delay setting data provided from the timing memory 312 and controls the power current of the buffer 176 according to the current to regulate the amount of delay. The buffer 176 delays the signal outputted by the AND circuit 316 and outputs the same. The current sources 174 and 178 define the power current of the buffer 176.

Figure 13:
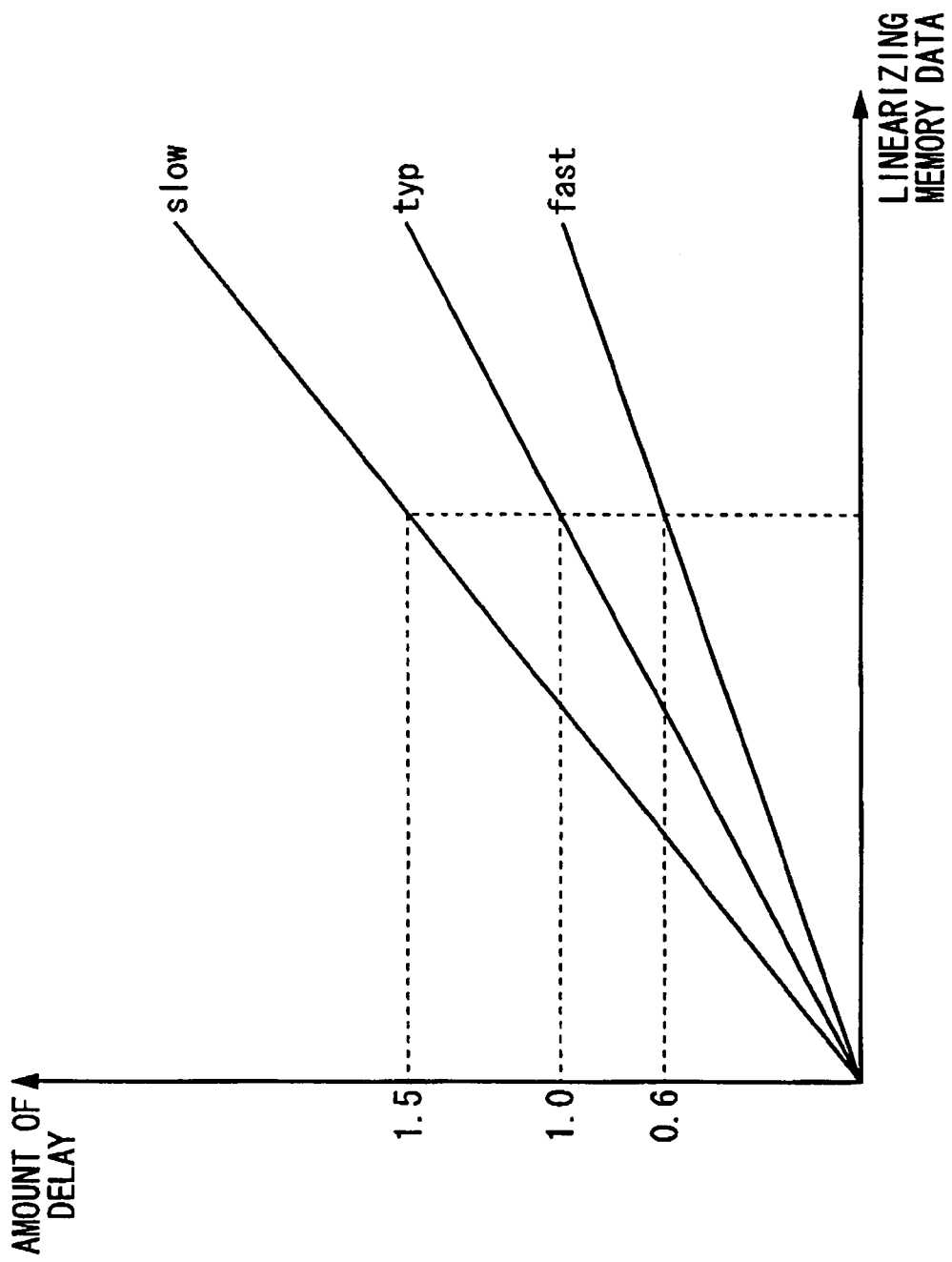
FIG. 13 shows the amount of delay in a micro-delay section 330 for the control data provided from a linearizing memory 318 to the micro-delay section 330.

In the micro-variable delay circuit 20 according to the present embodiment as shown in FIG. 13, each components are configured such that the delay setting data provided from the timing memory 312 is equal to the actual amount of delay under the condition of the voltage and the temperature which cause the fluctuation of the amount of delay to be maximized (slow). Therefore, the first register 162 and the second register 164 store control data set in order that the delay setting data provided from the timing memory 312 is equal to the actual amount of delay under the condition of the voltage and the temperature which cause the fluctuation of the amount of delay to be maximized (slow).

The first DAC 168 receives delay setting data from the timing memory 312 and generates a current proportional to the delay setting data. The second register 164 stores a complemented value to compensate the current outputted from the first DAC 168. For example, the second register 164 stores the coefficient of fluctuation of the amount of delay due to a predetermined process tolerance, and the fluctuation of voltage and temperature. The first DAC 168 controls the ratio between the delay setting data and the output current based on the coefficient of fluctuation. Thereby the current with the amount of delay which has been compensated can be generated.

The bias circuit 172 receives an output current from the first DAC 168 though the adding section 170 and controls a power current provided from the current sources 174 and 178 to the buffer 176 based on the output current. Thereby the amount of delay in the buffer 176 can be controlled to a desired mount of delay substantially equal to the delay setting data.

The buffer 176 may be configured by a CMOS circuit. Here, the relationship between the received power current and the amount of delay can be indicated by a hyperbola. The second DAC 166 generates an offset current in order to operate the buffer 176 in a region in which the relationship between the power current and the amount of delay can be approximately linear line. The adding section 170 adds the offset current to the output current of the first DAC 168 to output the same to the bias circuit 172.

Figure 3:
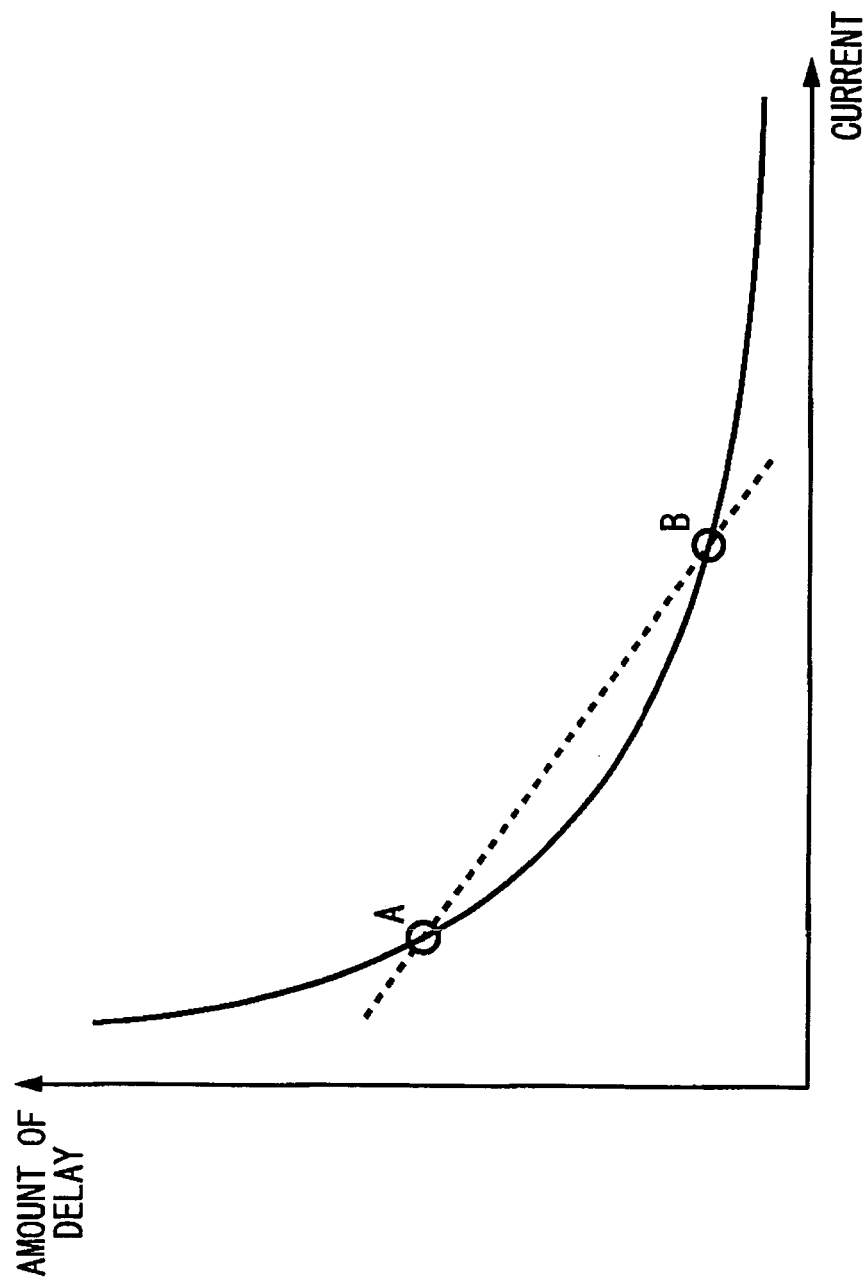
FIG. 3 shows a relationship between the power current and the amount of delay in a buffer 176.

FIG. 3 shows a relationship between the power current and the amount of delay in the buffer 176. The axis of abscissas indicates the power current provided to the buffer 176 and the axis of ordinates indicates the amount of delay in FIG. 3. As described above, the second DAC 166 generates an offset current to shift the operation region of the buffer 176 to the approximate linear region between A and B as shown in FIG. 3. For example, the second DAC 166 generates an offset current corresponding to a point A. The first register 162 previously stores a setting value to generate the offset current. The setting value is previously determined based on the characteristic of the buffer 176.

Thus, the micro-variable delay circuit 20 according to the present embodiment can compensate the fluctuation of the amount of delay with the circuit configuration in which only the first register 162 and the second register 164 are required to compensate without the linearizing memory 31 with the large storage.

Figure 4:
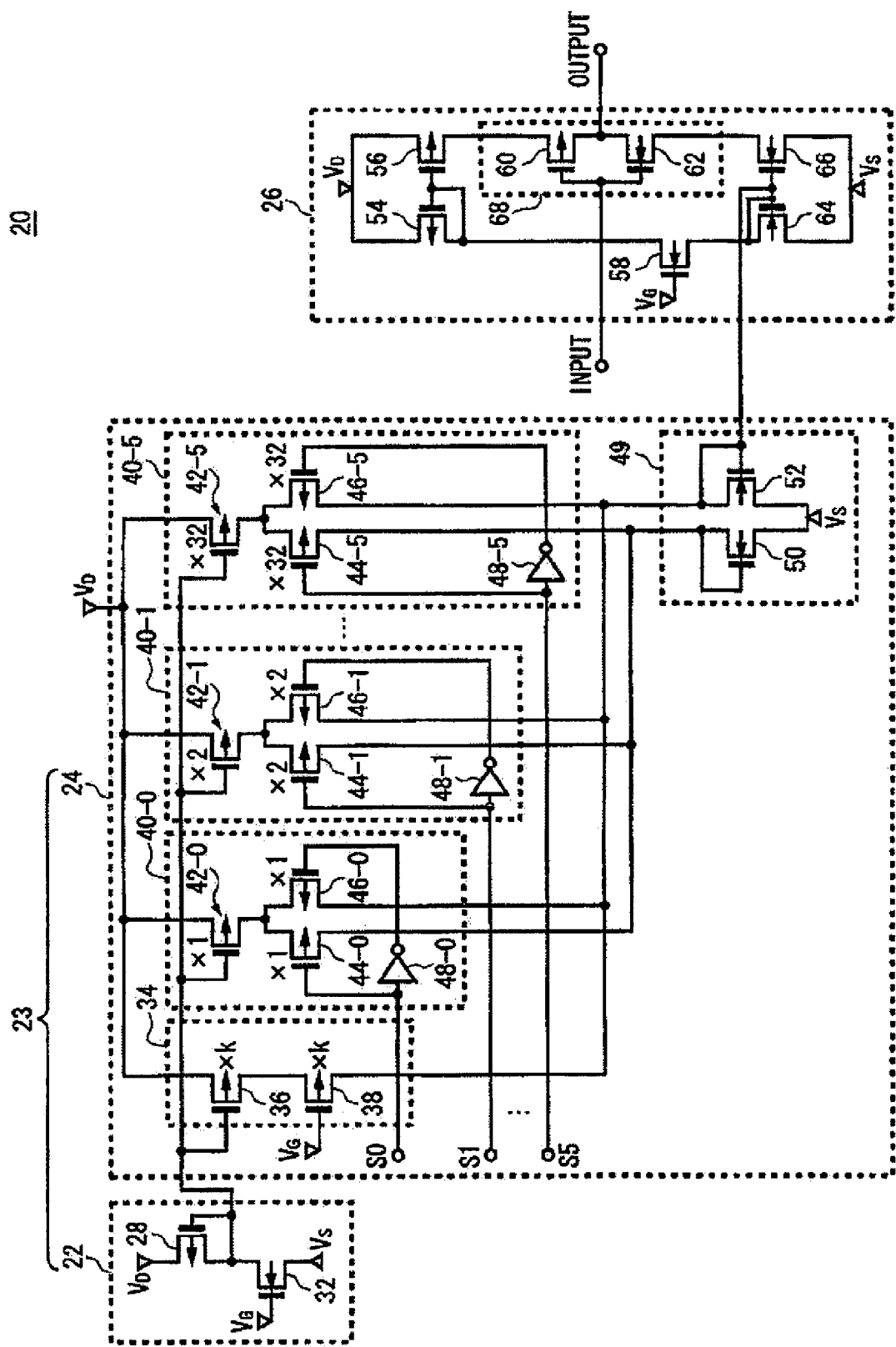
FIG. 4 shows an example of a delay circuit operating as the timing generator 16.

FIG. 4 shows an example of the detailed configuration of the micro-variable delay circuit 20. The micro-variable delay circuit 20 has a voltage generating section 23 for generating a reference voltage according to a delay time setting and a delay section 26. The voltage generating section 23 has a reference current source 22 and a current-voltage converting section 24. Additionally, S0-S5 shown in FIG. 4 correspond to the delay setting data indicative of the delay time setting described in FIG. 2. The offset current generating circuit 34 corresponds to the second DAC 166 described in FIG. 2. The amount of delay converting current generating circuit 40 corresponds to the first DAC 168 described in FIG. 2. The voltage converting circuit 49 and the delay section 26 correspond to the adding section 170, the bias circuit 172 and the current sources 174 and 178.

The base current source 22 generates a predetermined direct base current. The current-voltage converting section 24 generates a base voltage based on the base current generated by the base current source 22 and provides the same to the delay section 26. At this time, the current-voltage converting section 24 receives a desired delay time setting in the timing generator 16 and generates the base voltage with a level according to the delay time setting. The current-voltage converting section 24 according to the present embodiment generates a current of which magnitude is any integral multiple of k times—k+63 times as large as the base current and converts the generated current to the voltage to generate the base voltage. As shown in FIG. 4, the current-voltage converting section 24 receives the magnification 0-63 indicated by the 6 bit binary number from S0 to S5 as the delay time setting.

The delay section 26 delays an input signal by the amount of delay according to the received base current and outputs the same. Next, it will be described in detail that the configuration and the operation of the current-voltage converting section 24 and the delay section 26.

The base current source 22 has a p-MOS transistor 28 and a n-MOS transistor 32. Here, the p-MOS transistor is a p-channel type MOS (metal-oxide-semiconductor) transistor, and the n-MOS transistor is a n-channel type MOS transistor.

In the p-MOS transistor 28, a predetermined source voltage VD is provided to a source terminal, and a gate terminal and a drain terminal are connected each other. Meanwhile, in the n-MOS transistor 32, a predetermined gate voltage VG is provided to a gate terminal, a drain terminal is connected to a drain terminal of the p-MOS transistor 28, and a predetermined source voltage VS is provided to a source terminal. Thereby the base current source 22 generates a predetermined base current and outputs the drain voltage and the gate voltage of the p-MOS transistor 28 to the current-voltage converting section 24 as the predetermined voltage.

The current-voltage converting section 24 has an offset current generating circuit 34, a plurality of amount of delay converting current generating circuits (40-0-40-5, hereinafter generally referred to as 40), and a voltage converting circuit 49. The current-voltage converting section 24 generates a base voltage according to the delay time setting.

Additionally, the current-voltage converting section 24 according to the present embodiment has six amount of delay converting current generating circuits 40. However, the number of current-voltage converting sections 24 is not limited to six. The current-voltage converting section 24 has the number of amount of delay converting current generating circuit 40 dependent on the necessary delay time setting range and the delay time setting resolution.

The offset current generating circuit 34 and the plurality of amount of delay converting current generating circuit 40 are provided in parallel with the terminals receiving the source voltage VD, respectively. The offset current generating circuit 34 generates an offset current with the magnitude being k times as large as the base current. The offset current generating circuit 34 according to the present embodiment has k th of p-MOS transistors 36 provided in parallel, and k th of n-MOS transistors 38 provided in parallel. In each of the p-MOS transistors 36, the source voltage VD is applied to the source terminal and the drain terminal is connected to the source terminal of the p-MOS transistor 38. Each p-MOS transistor has approximately the same characteristic and each n-MOS transistor has approximately the same conductive characteristic in the present specification. Additionally, the gate terminal of the p-MOS transistor 36 is connected to the gate terminal of the p-MOS transistor 28. Thereby the offset current with the magnitude being k times as large as the base current is applied to the offset current generating circuit 34.

Each of the amount of delay converting current generating circuits 40-$x$ amplifies the base current with the different magnification, respectively. Each of the amount of delay converting current generating circuits 40-$x$ according to the present embodiment generates a current with the magnification being $2^x$ times as large as the base current, respectively. Additionally, $S_X$ bit for each delay time setting is provided to each of the amount of delay converting current generating circuits 40-$x$. Each of the amount of delay converting current generating circuits 40-$x$ has a dummy current path and an amount of delay converting current path, respectively. When the provided bit is 0, the generated current is applied to the dummy current path. Meanwhile when the provided bit is 1, the generated current is applied to the amount of delay converting current path.

Each of the amount of delay converting current generating circuits 40-$x$ according to the present embodiment includes $2^x$ th of p-MOS transistors 42-$x$ provided in parallel, 2x th of p-MOS transistors 44-$x$ provided in parallel and operating as the above-described amount of delay , $2^x$ th of amount of delay p-MOS transistors 46-$x$ provided in parallel and operating as the above-described amount of delay converting current path and an inverter circuits 48-$x$.

In the p-MOS transistors 42-$x$, the source voltage VD is applied to the source terminal and the gate terminal is connected to the gate terminal of the p-MOS transistor 28 as well as the p-MOS transistor 36. That is to say, the total sum of the current applied to the $2^x$ th of p-MOS transistors 42-$x$ provided in parallel becomes $2^x$ times as large as the base current.

The p-MOS transistors 44-X and the p-MOS transistors 46-$x$ are provided in series with the p-MOS transistors 42-$x$. The bit of the delay time setting $S_x$ are inputted to the gate terminal of the p-MOS transistor 44-$x$. The inversion bit of the delay time setting $S_x$ is inputted to the gate terminal opf the p-MOS transistors 46-$x$ through the inverter circuits 48-$x$. That is to say, the current applied to the p-MOS transistors 42-X is applied to any of the p-MOS transistors 44-$x$ or the p-MOS transistors 46-$x$ dependent on the delay time setting $S_x$.

That is to say, the plurality of inverters 48 selects one or more currents from the plurality of currents amplified in each of the amount of delay converting current generating circuit 40, applies the selected current to the amount of delay converting current path and operates as a selecting section for applying the current not being selected to the dummy current path.

The voltage converting circuit 49 generates the base voltage based on the sum total of the current applied to the amount of delay converting current path for each of the amount of delay converting current generating circuit 40. The voltage converting circuit 49 has a dummy transistor 50 and a converting transistor 52. The total sum of the current applied to the dummy current path for each of the amount of delay converting current generating circuits 40 is applied to the drain terminal of the dummy current path. The total sum of the current applied to the amount of delay converting current path of each of the amount of delay converting current generating circuit 40 is applied to the converting transistor 52. Additionally, in the converting transistor 52, a predetermined source voltage VS is applied to the source terminal, and the drain terminal and the gate terminal are connected each other. Therefore, the converting transistor 52 operates as a converter for generating the base voltage based on the total sum of the current amplified by the amount of delay converting current generating circuit 40 selected by the selecting section.

Thereby the gate voltage of the converting transistor 52 becomes a voltage according to the delay time setting, and the voltage converting circuit 49 applies the gate voltage of the converting transistor 52 to the delay section 26 as the base voltage. According to the current-voltage converting section 24 according to the present embodiment can create the base voltage according to a desired delay time setting. Additionally, the consumption current in the plurality of amount of delay converting current generating circuit 40 is fixed regardless of the delay time setting. The offset current applied to the offset current generating circuit 34 is previously determined as a fixed value according to the characteristic of the delay section 26. Therefore, even if the delay time setting is changed at actually operating, the total sum of the consumption current in the current-voltage converting section 24 can be fixed and the calorific value can be stabilized. Therefore, each of the characteristic of the transistors is not fluctuated according to the delay time setting and the base voltage according to the delay time setting can be accurately generated.

The delay section 26 includes a delay element 68, a current supply section for supplying a current to the delay element 68 and a control section for controlling the current supply section. The control section according to the present embodiment includes a p-MOS transistor 54 as a fourth transistor, an n-MOS transistor 58 and an n-MOS transistor 64 as a third MOS transistor. The current supply section includes a p-MOS transistor 56 as a first MOS transistor and an n-MOS transistor 66 as a second MOS transistor.

The delay element 68 according to the present embodiment is an inverter including a p-MOS transistor 60 and a n-MOS transistor 62. The delay element 68 delays the input signal to output the same by charging/discharging the output capacity according to the input signal. Additionally, the delay element 68 delays the input signal by the delay time based on the supply current applied from the current supply section and outputs the same because the delay time in the delay element 68 is dependent on the charging/discharging time of the output capacity. The p-MOS transistor 56 provides a charge current to charge the output capacity of the delay element 68, and the n-MOS transistor 66 provides a discharge current to discharge the output capacity of the delay element 68 in the present embodiment.

In this embodiment, a reference clock is applied to the delay element 68 as an input signal. The delay element 68 may further include a capacitor provided in parallel with an inverter between the inverter and the output terminal and having a variable capacity. In this case, it is preferred that the capacity of the capacitance is controlled based on the variable range of the desired delay time setting.

a control current according to the provided base voltage is applied to the control section. Each transistor of the current supply section is current mirror-connected to the transistor of the control section and generates a supply current approximately the same as the control current. Therefore, the current-voltage converting section 24 generates the base voltage according to a desired delay time setting so that the amount of delay in the delay element 68 can be easily controlled.

The control section converts the base voltage received from the current-voltage converting section 24 to the control voltage dependent on the characteristic of the current supply section and provides the same to the current supply section in order to cause the current supply section to generate a supply current. The control current dependent on the given base voltage is applied to each transistor of the control section to generate a control voltage based on the control current. At this time, the control section preferably generates a first control voltage to operate the p-MOS transistor 56 in the saturation region and provides the same to the gate terminal of the p-MOS transistor 56. Additionally, the control section preferably generates a second control voltage to operate the n-MOS transistor 66 in the saturation region and provides the same to the gate terminal of the n-MOS transistor 66.

A predetermined source voltage VD is applied to the source terminal of the p-MOS transistor 54, and the gate terminal and the drain terminal are electrically connected each other. That is to say, the p-MOS transistor 54 operates as a resistance to generate the potential difference according to the control current between the drain terminal and the source terminal. The p-MOS transistor 54 generates a first control voltage to control a supply current generated by the p-MOS transistor 56 based on the potential difference. The drain terminal of the p-MOS transistor 54 is electrically connected to the drain terminal of the n-MOS transistor 64 through the n-MOS transistor 58.

A predetermined source voltage VS is applied to the source terminal of the n-MOS transistor 64. The gate terminal and the drain terminal of the converting transistor 52 are electrically connected. The base voltage is applied from the converting transistor 52 to the gate terminal of the n-MOS transistor 64 to limit the magnitude of the control current according to the base voltage. That is to say, the n-MOS transistor 64 operates as a resistance to generate the voltage dependent on the control current between the drain terminal and the source terminal as well as the converting transistor 52. The n-MOS transistor 64 generates the second control voltage to control the supply current generated by the n-MOS transistor 66 based on the potential difference.

The p-MOS transistor 54 and the p-MOS transistor 56, and the n-MOS transistor 64 and the n-MOS transistor 66 are current mirror-connected, as shown in FIG. 4 to generate approximately the same drain current, respectively. Additionally, in the delay section 26, it is preferred that the n-MOS transistor and the p-MOS transistor have the characteristic such that the drain current for each of the n-MOS transistor and the p-MOS transistor is approximately the same when the same gate voltage and the same drain voltage are applied thereto. For example, each transistor may have the gate width and the gate length such that the drain current is approximately the same under the above described condition. Additionally, the p-MOS transistor group provided in parallel may be used as one p-MOS transistor.

In another embodiment, the n-MOS transistor 64 may be a n-MOS transistor group including n th of n-MOS transistors provided in parallel, and the n-MOS transistors 66 may be a n-MOS transistor group including m-th of n-MOS transistors provided in parallel. Thus, each of the number of MOS transistors current mirror-connected in parallel is adjusted so that the ratio between the control current and the supply current can be n:m and a desired supply current can be created.

It is preferred that the offset current generating circuit 34 of the current-voltage converting section 24 generates the offset current with the magnitude enough to operate the p-MOS transistor (54 and 56) and the n-MOS transistor (64 and 66) in the saturation region within the delay time setting. Here, the saturation region indicates the region in which the potential difference between the drain terminal and the source terminal is larger than the value obtained by subtracting the threshold voltage defined by the characteristic of the MOS transistor from the potential difference between the gate terminal and the source terminal in the MOS transistor. The transistor for each of the current supply sections can be operated in the saturation region so that the magnitude of the supply current is linearly fluctuated with respect to the fluctuation of the delay time setting. Therefore, the amount of delay in the delay element 68 can be accurately controlled. The offset current value to operate each transistor in the saturation region can be easily defined by previously measuring.

Figure 5:
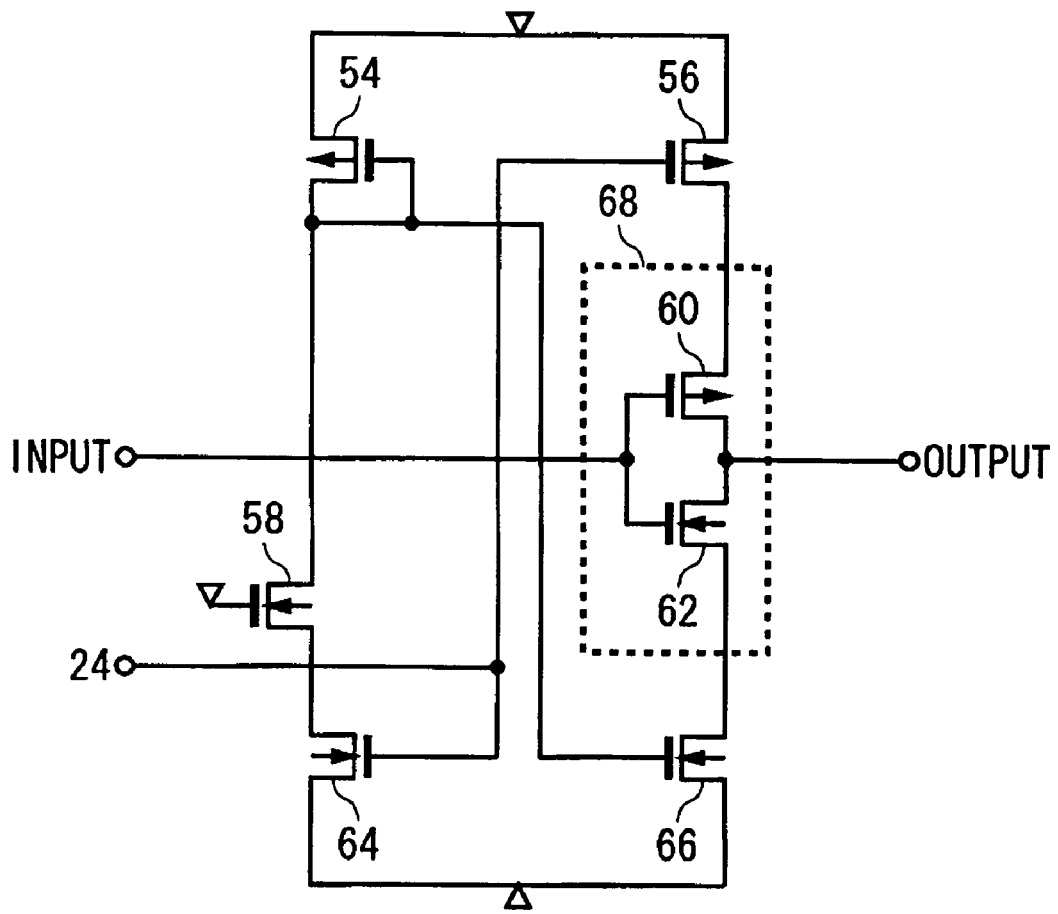
FIG. 5 shows another example of the configuration of a delay section 26.

FIG. 5 shows another embodiment of the configuration of a delay section 26. In the delay section 26 according to the present embodiment, the gate connection for each of the p-MOS transistor 54, the n-MOS transistor 64, the p-MOS transistor 56 and the n-MOS transistor 66 is different from that of the delay section 26 described with reference FIG. 4. The other configuration is same as the delay section 26 in FIG. 4 so that the description is omitted.

The gate terminal of the n-MOS transistor 64 and the gate terminal of the p-MOS transistor 56 are electrically connected in the present embodiment. That is to say, the n-MOS transistor 64 generates a first control voltage to control the p-MOS transistor 56 based on the potential difference between the drain terminal and the source terminal, which is generated due to the control current.

Additionally, the gate terminal and the drain terminal of the p-MOS transistor 54, and the gate terminal of the n-MOS transistor 66 are electrically connected. That is to say, the p-MOS transistor 54 generates a second control voltage to control the n-MOS transistor 66 based on the potential difference between the drain terminal and the source terminal.

The control current applied to the control section and the supply current generated by the current supply section are approximately the same in FIG. 4. However, the current supply section generates the supply current different from the control current in the present embodiment. Additionally, the offset current generating circuit 34 generates an offset current with the magnitude enough to operate the n-MOS transistor 64 and the p-MOS transistor 54 in the linear region and also to operate the p-MOS transistor 56 and the n-MOS transistor 66 in the saturation region in the present embodiment. Here, the linear region indicates a region in which the potential difference between the drain terminal and the source terminal is smaller than the value obtained by subtracting the threshold value defined by the characteristic of the MOS transistor from the potential difference between the gate terminal and the source terminal in the MOS transistor.

According to the present embodiment, the transistor for each of the current supply sections can operate in the saturation region. Therefore, the magnitude of the supply current is linearly fluctuated with respect to the fluctuation of the delay time setting. Therefore, the amount of delay in the delay element 68 can be accurately controlled. Additionally, the transistor for each of the control sections is operated in the linear region, so that the amount of consumption current in the control section can be reduced.

Figure 6A:
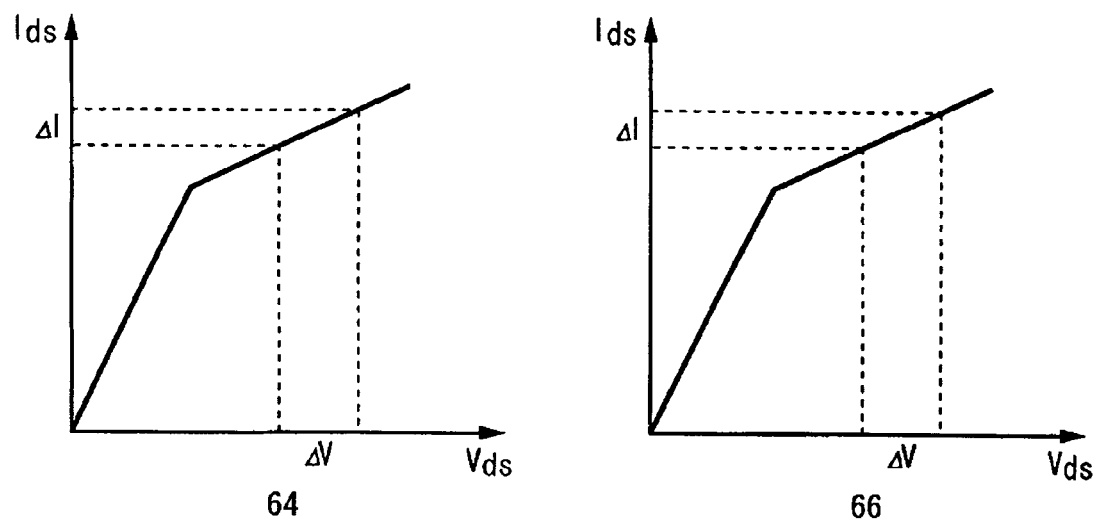
FIG. 6A shows the characteristic of the delay section 26 shown in FIG. 4.
Figure 6B:
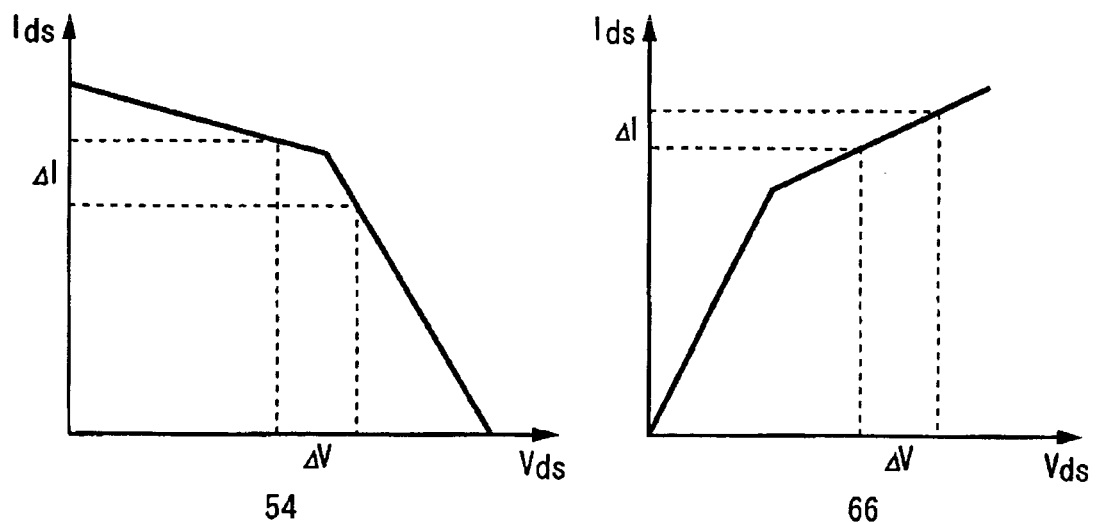
FIG. 6B shows the characteristic of the delay section 26 shown in FIG. 6B.

FIG. 6A shows the characteristic of the delay section 26. FIG. 6B shows the characteristic of the delay section 26. As described above, the delay section 26 operates the p-MOS transistor 56 and the n-MOS transistor 66 in the saturation region to function as the current power.

In the delay section 26 shown in FIG. 4, the p-MOS transistor 54 and the p-MOS transistor are current mirror-connected each other. The converting transistor 52, n-MOS transistor 64 and n-MOS transistor 66 are also current mirror-connected each other. Therefore, all of the transistors operate in the saturation region.

In order to operate the converting transistor 52 in the saturation region, a current enough to saturate the converting transistor 52 is required, so that the power consumption will be increased. However, if the current mirror-connected transistor is operated in the saturation region, the linearity in the n-MOS transistor 66 can be kept even if any fluctuation and variation $\Delta I$ and $\Delta V$ of a current Ids or a voltage Vds is generated in the n-MOS transistor 64.

Meanwhile, in the delay section 26 shown in FIG. 5, the gate potential for the p-channel and the n-channel of the p-MOS transistor 54 and the p-MOS transistor 56 are replaced each other. Additionally, the gate potential for the p-channel and the n-channel of the p-MOS transistor 56 and the n-MOS transistor 64 are replaced each other. Therefore, the converting transistor 52, the n-MOS transistor 64 and the p-MOS transistor 54 operates in the unsaturation region, respectively.

Thus the converting transistor 52 operates in the unsaturation region, the power consumption in the converting transistor 52 is reduced. In this case, however, the linearity of the n-MOS transistor 66 can not be kept when a fluctuation and variation $\Delta I$ and $\Delta V$ of a current Ids and a voltage Vds are generated in the p-MOS transistor 54.

As described above, each delay section 26 has the different power consumption and linear characteristic. Therefore, an appropriate delay section 26 can be used according to the object of the micro-variable delay circuit 20.

Figure 7:
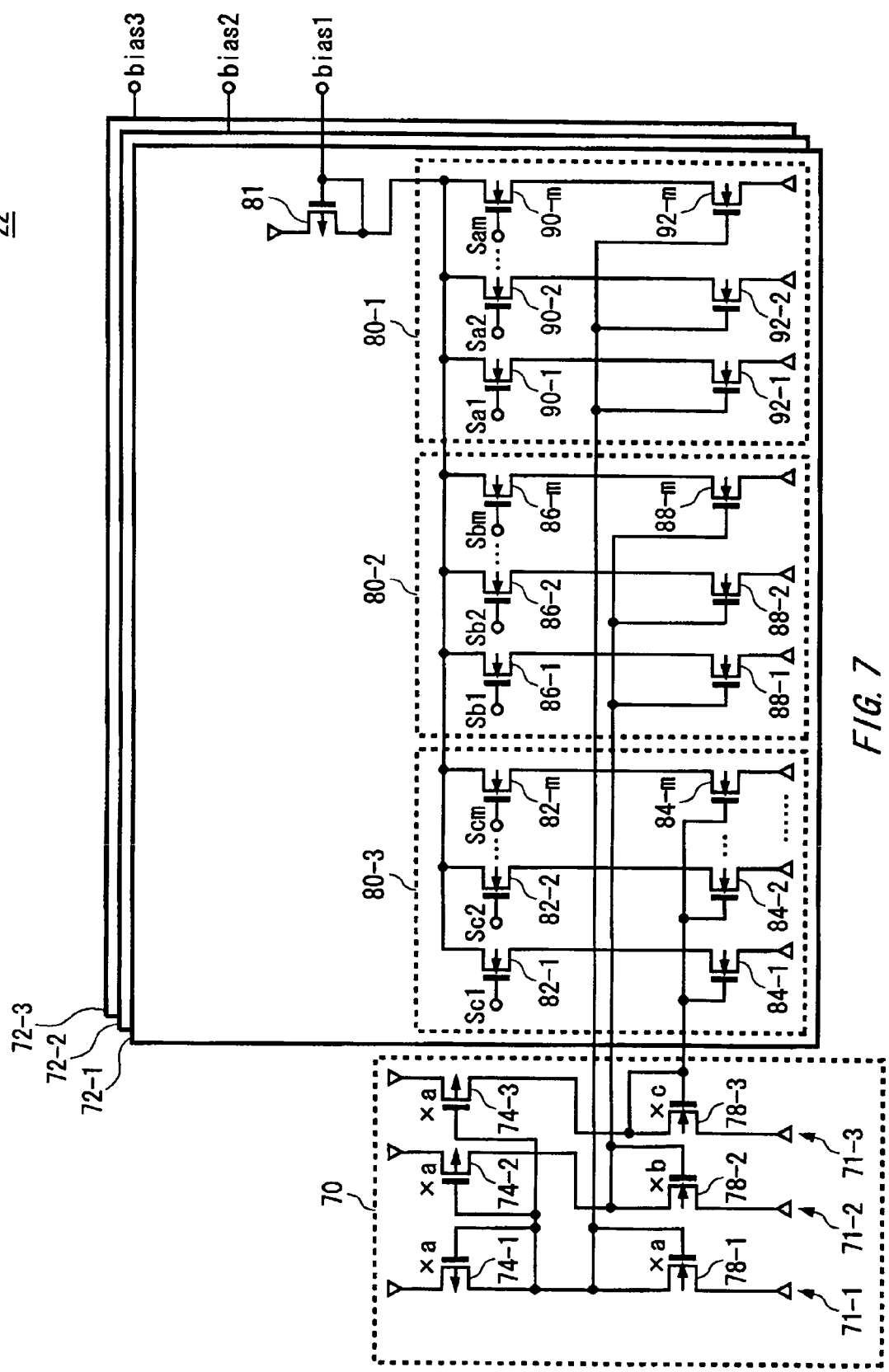
FIG. 7 shows another example of the configuration of a base current source 22.

FIG. 7 shows another example of the configuration of the base current source 22. The base current source 22 according to the present embodiment generates the plurality of base currents with the different magnitude according to the resolution of the delay time setting. When the base current source 22 according to the present embodiment is used, it is preferred that the current-voltage converting section 24 has the configuration after described with reference to FIG. 9 and FIG. 10. The base current source 22 and the current-voltage converting section 24 described with reference to FIG. 4 generates the base voltage based on one base current. Therefore, the resolution of the base voltage is determined based on the magnitude of the predetermined base current. Meanwhile, the current-voltage converting section 24 can generate the base voltage based on the plurality of base currents with the different magnitude as the resolution, so that the base voltage can be generated with the precise resolution in larger range.

That is to say, the amount of delay in the delay section 26 can be controlled with the precise resolution in larger range.

The base current source 22 according to the present embodiment includes a current source 70 of which magnitude can be optionally adjusted and a plurality of base current converting section (72-1-72-3, hereinafter generally referred to as 72). The current source 70 includes a plurality of reference current sources for generating the base current with the different magnitude, respectively. The current source 70 according to the present embodiment includes a first reference current source 71-1, a second reference current source 71-2 and a third reference current source 71-3. The first reference current source 71-1 includes a th of p-MOS transistors 74-1 provided in parallel and a th of p-MOS transistors 78-1 provided in parallel. The second reference current source includes a th of p-MOS transistors 74-2 provided in parallel and b th of n-MOS transistors 78-2 provided in parallel. The third reference current source includes a th of p-MOS transistors 74-3 in parallel and c th of n-MOS transistors 78-3 in parallel. Where, each of a, b, c is integer satisfying a<b<c).

Each of the p-MOS transistors 74 are current mirror-connected. Approximately the same current $a \times I_0$ is applied to each of the reference current source. The first reference current source 71-1 divides the first reference current $a \times I_0$ into each of the a th of n-MOS transistors 78-1 to generate the first reference current $I_0$.

Additionally, the second reference current source 71-2 divides the current $a \times I_0$ into each of the b th of n-MOS transistors 78-2 to generate the second reference current being a/b times as large as the first reference current. That is to say, a current $I_0 \times a/b$ applied to one n-MOS transistor 78-2 will be the second reference.

The third reference current source 71-3 divides the current $a \times I_0$ into each of the c th of n-MOS transistors 78-3 provided in parallel to generate a third reference current being a/c times as large as the first reference current. That is to say, a current $I_0 \times a/c$ applied to one n-MOS transistor 78-3 will be the third reference.

Then, a plurality of base current converting sections 72 generate the base current with the difference magnitude each other based on the first reference current, the second reference current and the third reference current. Each of the reference converting sections 72 has a plurality of amplifying sections and p-MOS transistors corresponding to the plurality of reference current sources. In the present embodiment, the base current converting section 72 has a first amplifying section 80-1, a second amplifying section 80-2 and a third amplifying section 80-3.

The first amplifying section 80-1 includes a plurality of n-MOS transistors (92-1-92-m, hereinafter referred to as 92), and a plurality of switches (90-1-90-m, hereinafter referred to as 90). Each of the n-MOS transistors 92 is connected to the n-MOS transistor 78-1 and a current mirror. Additionally, the switches 90 are provided corresponding to each of the n-MOS transistors 92 and switches to apply the current to the corresponding n-MOS transistors 92. Thereby the plurality of switches 90 are regulated to control the number of n-MOS transistors 92 to which the current with the magnitude the same as the first reference current is controlled, so that a current obtained by amplifying the magnitude of the first reference current to any integral multiple can be generated.

Additionally, the second amplifying section 80-2 and the third amplifying section 80-3 have the configuration the same as the first amplifying section 80-1 and generate the current obtained by amplifying the magnitude of the second reference current and the third reference current to the any integral multiple, respectively.

Then, p-MOS transistor 81 generates the sum of the current generated by the first amplifying section 80-1, the second amplifying section 80-2, the third amplifying section 80-3 as the base reference and outputs the voltage according to the base current. Thereby the base current converting section 72 can generate the base current with the any magnification. Additionally, the plurality of current converting sections 72 individually operate, so that the base current source 22 can easily generate a plurality of base currents with any magnitude each other. The resolution of the amount of delay in the delay section 26 is defined based on the magnitude of the base current generated by the base current source 22. Here, the base current source 22 according to the present embodiment can create the base current appropriate for the resolution of the necessary amount of delay. Additionally, the base current source 22 according to the present embodiment can create a plurality of base currents having the different magnitude with the precise resolution of the delay time setting within a wide range.

Figure 8:
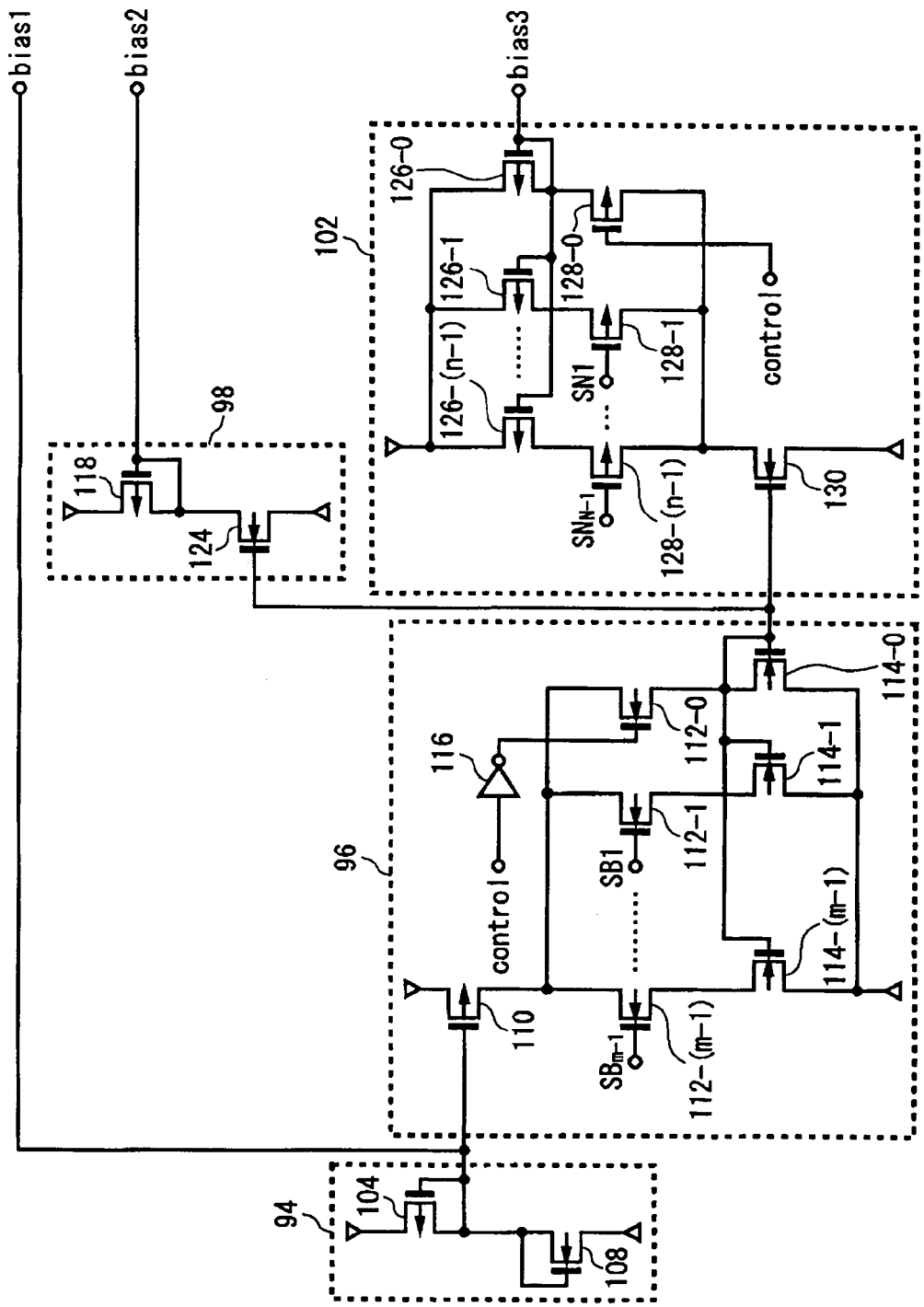
FIG. 8 shows further another example of the configuration of the base current source 22.

FIG. 8 shows further another example of the configuration of the base current source 22. The base current source 22 according to the present embodiment generates a plurality of base currents with the different magnitude according to the resolution of the delay time setting as well as the base current source 22 described in FIG. 7. In this case, the current-voltage converting section 24 preferably has the after-described configuration with reference to FIG. 9 or FIG. 10.

The base current source 22 according to the present embodiment includes a current source 94, a plurality of current dividing sections (96 and 102) and a mirror circuit 98. The current source 94 includes a p-MOS transistor 104 and a n-MOS transistor 108. The p-MOS transistor 104 and the n-MOS transistor are provided in series between a predetermined drain potential VD and a predetermined source potential VS and generate a first base current with a predetermined magnitude.

The first current dividing section 96 divides the first base current into a plurality of transistors provided in parallel and generates a second base current with the magnitude being one time as large as the integer of the first base current. The first current dividing section 96 according to the present embodiment includes p-MOS transistor 110, a plurality of n-MOS transistors 112 and a plurality of n-MOS transistors 114.

The p-MOS transistor 110 is current mirror-connected to the p-MOS transistor 104 and applies a first base current. Then, the plurality of n-MOS transistors 114 are connected to the p-MOS transistors 110 in series and provided in parallel, respectively to divide the first base current. Additionally, the plurality of n-MOS transistors 112 are provided corresponding to the plurality of n-MOS transistors 114 and switches to divide the base current into the corresponding to the n-MOS transistor 114. Here, the n-MOS transistor 112 according to the present embodiment always divides the first base current into the corresponding n-MOS transistor 114 to generate a second base current. The number of n-MOS transistors 114 into which the first base current is divided is regulated, so that the magnitude of a second base current applied to the n-MOS transistor 114-0 can controlled to 1/w times of the base current, where w is any integer as large as the first base current.

The mirror circuit 98 includes a n-MOS transistor 124 which is current mirror-connected to the n-MOS transistor 114 and applies a second base current, and a p-MOS transistor 118 which is connected in series and to which the second base current is applied. Then, the p-MOS transistor 118 is current mirror-connected to the p-MOS transistor of a current-voltage converting section 24 after-described with reference to FIG. 9 and FIG. 10.

Figure 9:
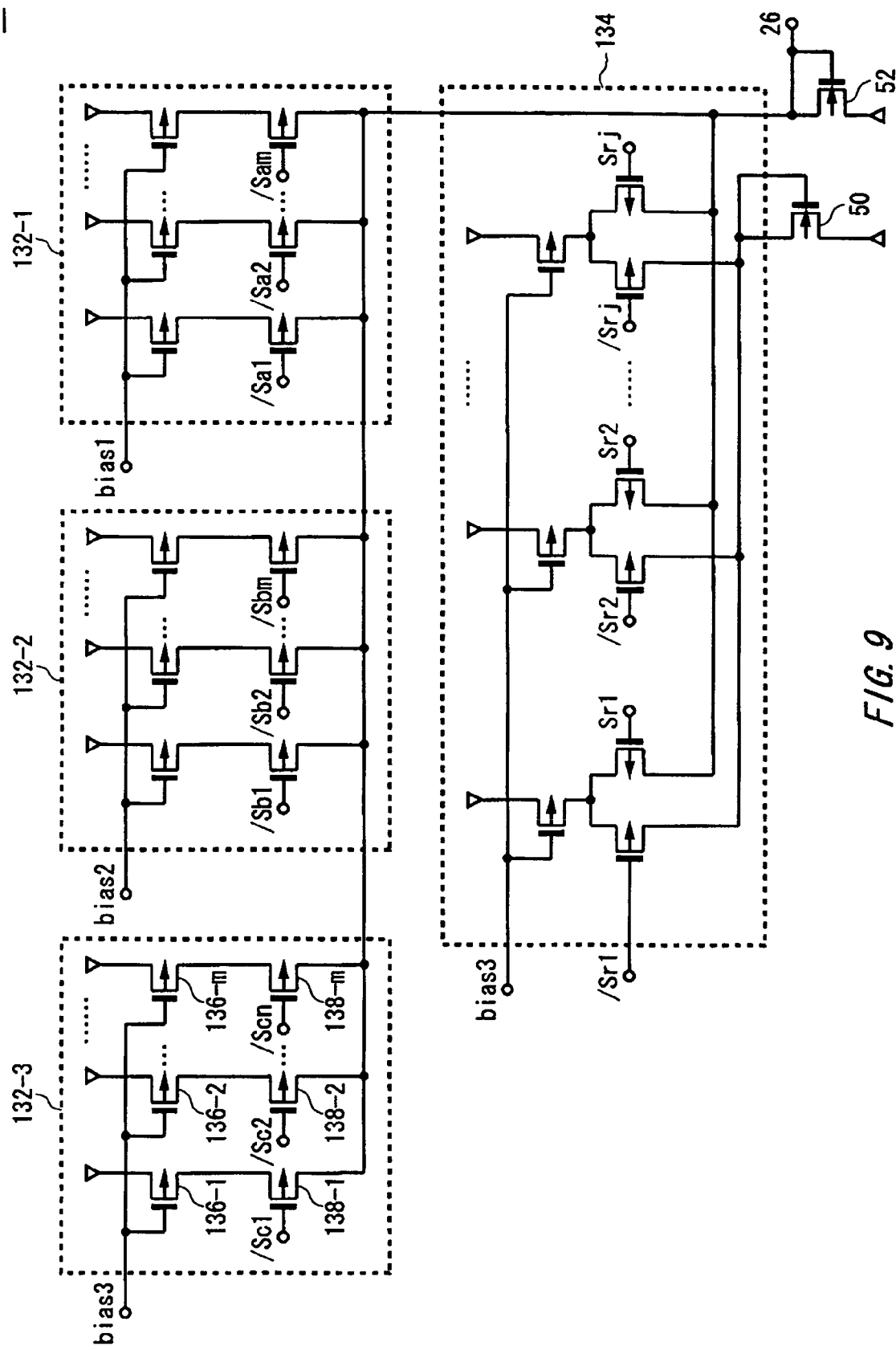
FIG. 9 shows another example of the configuration of the current-voltage converting section 24.
Figure 10:
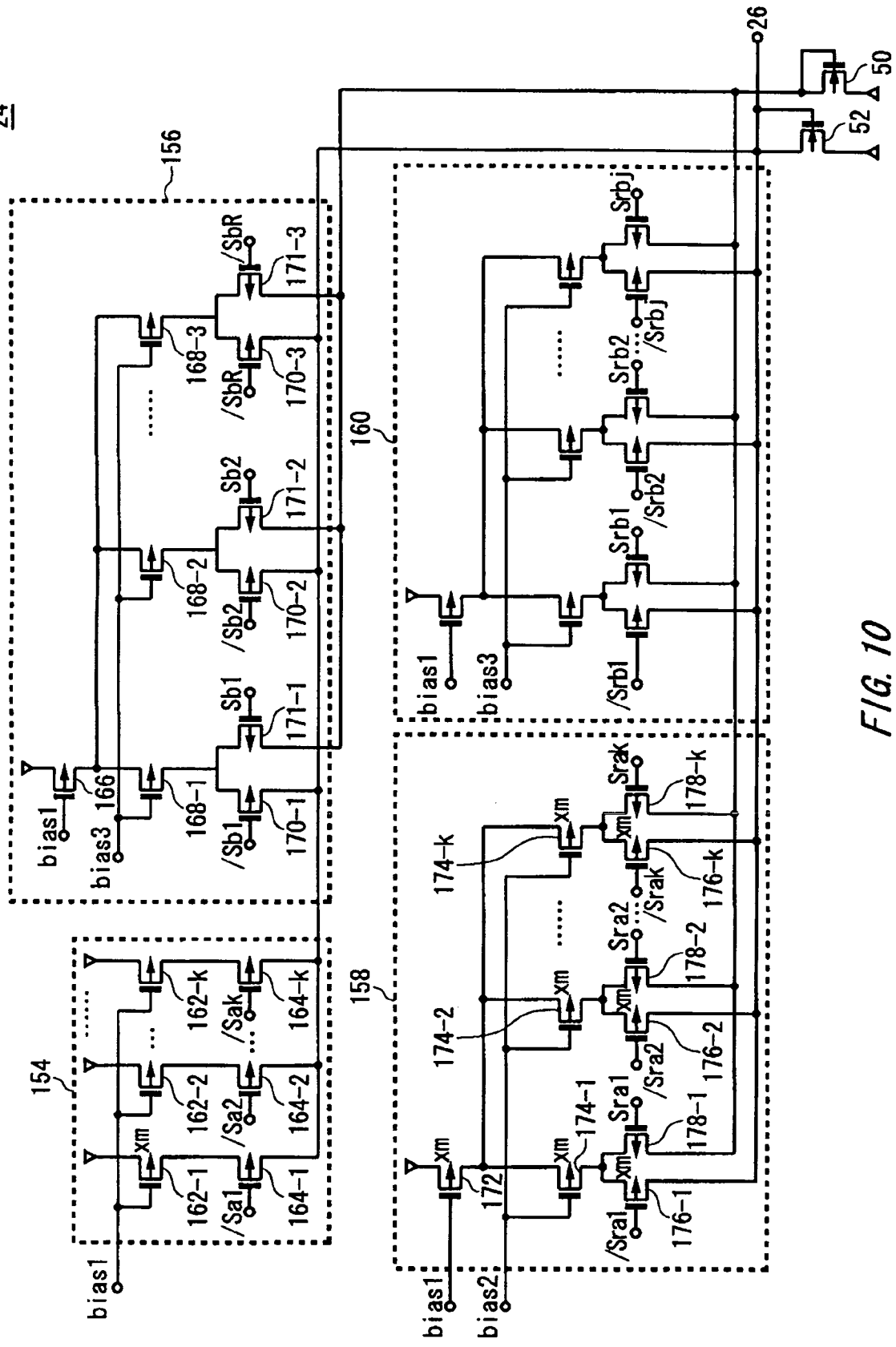
FIG. 10 shows further another example of the configuration of the current-voltage converting section 24.

The base current source 22 and the current-voltage converting section 24 can apply/receive the base current by current mirror-connecting the p-MOS transistors each other as shown in FIG. 9 and FIG. 10. The mirror circuit 98 according to the present embodiment can easily apply/receive the base current to the p-MOS transistor in the current-voltage converting section 24 even if the base current is generated using the n-MOS transistor such as the first current dividing section 96.

The second current dividing section 102 divides the second base current into a plurality of transistors provided in parallel as well as the first current dividing section 96 and generates a third current with the magnitude being one times as large as the integer of the second base current. The second current dividing section 102 according to the present embodiment includes n-MOS transistor 130, a plurality of p-MOS transistors 128 and a plurality of p-MOS transistors 126.

The n-MOS transistor 130 is current mirror-connected to the n-MOS transistor 114 and applies a second base current. Then, the plurality of p-MOS transistors 126 divide the second base current as well as the plurality of n-MOS transistors 114. The plurality of p-MOS transistors 128 switches to divide the second base current into the corresponding to the p-MOS transistor 126. The base current source 22 according to the present embodiment can create a plurality of base currents with the different magnitude in a compact circuit.

FIG. 9 shows another example of the configuration of the current-voltage converting section 24. The current-voltage converting section 24 according to the present embodiment receives a plurality of base currents with the different magnitude, amplifies each base current according to the delay time setting and generates a base voltage applied to the delay section 26 based on the sum of the plurality of amplified base currents.

The current-voltage converting section 24 according to the present embodiment includes a plurality of offset current generating circuits (132-1-132-3, hereinafter referred to as 132), an amplifying section 134, a dummy transistor 50 and a converting transistor 52. The functions of the dummy transistor 50 and the converting transistor 52 are the same as that of the dummy transistor 50 and the converting transistor 52 described with reference to FIG. 4.

Each of the offset current generating circuits 132 receives the base currents with different magnitude, amplifies the received base current, respectively and provides the sum of the amplified offset current to the converting transistor 52. For example, the plurality of offset current generating circuits 132 may be provided corresponding to the plurality of base current converting sections 72 described with reference to FIG. 7, and also may be provided corresponding to the current source 94, the second current dividing section 102 and the mirror circuit 98, respectively. Now it will be described about the case that the offset current generating circuits (132-1-132-3) are provided corresponding to the base current converting section (72-1-72-3).

Each of the offset current generating circuits 132 has a plurality of p-MOS transistors (136-1-136-*m*, hereinafter referred to as 136) and a plurality of p-MOS transistors (138-1-138-*m*, hereinafter referred to as 138).

The plurality of p-MOS transistors 136 are current mirror-connected to the p-MOS transistor 81 corresponding to the base current converting section 72, respectively. Then, the plurality of p-MOS transistors 138 are provided corresponding to the plurality of p-MOS transistors 136 and switches to apply the current to the corresponding p-MOS transistors 136. The number of p-MOS transistors 136 to which the current is applied is controlled so that an offset current with the magnitude being any integral multiple of the corresponding base current can be created.

The plurality of offset current generating circuits 132 according to the present embodiment selectively can amplify each of the plurality of base currents and add them each other to generate an offset current being capable of changing the smallest base current as the resolution within which the largest base current is amplified.

Additionally, the amplifying section 134 receives the base current generated by any of the plurality of base current converting sections 72 and amplifies the received base current based on the delay time setting. The amplifying section 134 may have the configuration except for the offset current generating circuit 34, the dummy transistor 50 and the converting transistor 52 of the current-voltage converting section 24 described with reference to FIG. 4. Additionally, the amplifying section 134 may amplify the smallest base current of the plurality of base currents based on the delay time setting. The current-voltage converting section 24 according to the present embodiment can set the offset current to a desired current.

FIG. 10 shows further another example of the current-voltage converting section 24. The current-voltage converting section 24 receives a plurality of base current with the different magnitude, amplifies each of the base currents according to the delay time setting and generates a base current to be provided to the delay section 26 based on the plurality of amplified base current. That is to say, the current-voltage converting section 24 sets the offset current and the voltage with a plurality of gradations.

The current-voltage converting section 24 according to the present embodiment includes a coarse current generating circuit 154, a precise offset current generating circuit 156, a coarse amplifying section 158, a precise amplifying section 160, a dummy transistor 50 and a converting transistor 52. The function of the dummy transistor 50 and the converting transistor 52 is the same as that of the dummy transistor 50 and the converting transistor 52 described in FIG. 4. Additionally, it will be described about the case that the base current source 22 has the configuration as shown in FIG. 8.

The coarse offset current generating section 154 and the precise offset current generating circuit 156 amplifies one or more base currents including the largest base current of a plurality of base currents to generate an offset current, generates the offset current obtained by amplifying the various base currents to any integral multiple and provides the same to the converting transistor 52. For example, the coarse offset current generating circuit 154 amplifies the first base current, and the precise offset current generating circuit 156 amplifies a third base current. The coarse offset current generating circuit 154 according to the present embodiment generates the offset current with a resolution based on the first base current, and the precise offset current generating circuit 156 according to the present embodiment generates the offset current with a resolution based on the third base current substantially smaller than the first base current.

The coarse offset current generating circuit 154 receives the largest base current of the plurality of base currents, amplifies the received base current to any integral multiple to generates an offset current. The coarse offset current generating circuit 154 has the function and the configuration the same as those of the offset current generating circuit 132 described with reference to FIG. 9. The coarse offset current generating circuit 154 includes a plurality of p-MOS transistors 162 current mirror-connected to the p-MOS transistor 104 of the current power 94 and receives a first base current.

The precise offset current generating circuit 156 receives the base current smaller than the base current received by the coarse offset current generating circuit 154, amplifies the received base current to any integral multiple and outputs the same. Here, the offset current generated by the precise offset current generating circuit 156 is smaller than the first base current received by the coarse offset current circuit 154. The precise offset current generating circuit 156 according to the present embodiment includes a p-MOS transistor 166, a plurality of p-MOS transistors 168, a plurality of p-MOS transistors 170 and a plurality of p-MOS transistors 171.

The p-MOS transistor 166 is current mirror-connected to the p-MOS transistor 104 of the current source 94. That is to say, the p-MOS transistor 166 limits the maximum value of the sum of the current applied to the plurality of p-MOS transistors 168 to a first base current. Additionally, a plurality of p-MOS transistors 168 provided in parallel each other are connected to the p-MOS transistors and current mirror-connected to the p-MOS transistor 126-0 of the second current dividing section 102, respectively, so that the current the same as the third base current is applied to each of the plurality of p-MOS transistors 168.

Each of the plurality of p-MOS transistors 170 are connected to the dummy transistor 50. Each of the plurality of p-MOS transistors 171 are connected to the converting transistor 52. Then, it is selected whether the base current received by each of the p-MOS transistors 168 is applied to the dummy transistor 50 or the converting transistor 52 according to a given offset time setting (sbl-sbj). Thereby the consumption current in the precise offset current generating circuit 156 is held constant while the current according to the offset time setting can be applied to the converting transistor 52. The coarse offset current generating circuit 154 and the precise offset current generating circuit 156 according to the present embodiment can easily create an offset current being capable of changing the third base current amplified by the precise offset current generating circuit 156 as a resolution between the minimum amplifying range and the maximum amplifying range of the first base current which are amplified by the coarse offset current generating circuit 154. In this case, the maximum value of the current which can be generated by the precise offset current generating circuit 156 may be approximately the same as the resolution of the current generated by the coarse offset current generating circuit 156.

The coarse amplifying section 158 and the precise amplifying section 160 amplify one or more base currents including the smallest base current of the plurality of base currents based on the delay time setting and provides the same to the converting transistor 52. The coarse amplifying section 158 and the precise amplifying section 160 have the same configuration in the present embodiment. For example, the coarse amplifying section 158 receives the second base current, and the precise amplifying section 160 receives the third base current. Then, each of the coarse amplifying section 158 and the precise amplifying section 160 amplifies based on the delay time setting. The coarse amplifying section 158 and the precise amplifying section 160 amplify the second base current and the third base current based on the delay time setting, respectively. That is to say, the coarse amplifying section 158 and the precise amplifying section 160 can adapt to the delay time setting with a plurality of gradations. For example, the coarse amplifying section 158 and the precise amplifying section 160 can generate a current being capable of changing with the resolution being the third base current amplified by the precise amplifying section 160 between the minimum amplifying range and the maximum amplifying range of the second base current amplified by the coarse amplifying section 158. In this case, the maximum value of the current which can be generated by the precise amplifying section 160 may be the same as the resolution of the current generated by the coarse amplifying section 158. Additionally, the current generated by each of the coarse amplifying section 158 and the precise amplifying section 160 according to the present embodiment is smaller than the first base current received by the coarse offset current generating circuit 154.

The coarse amplifying section 158 and the precise amplifying section 160 have a p-MOS transistor 172, a plurality of p-MOS transistors 174, a plurality of p-MOS transistors 176 and a plurality of p-MOS transistors 178.

The p-MOS transistor 172 is current mirror-connected to the p-MOS transistor 104 of the current power 94. The plurality of p-MOS transistors 174 have the function the same as that of the plurality of p-MOS transistors 42 described with reference to FIG. 4. The plurality of p-MOS transistors 176 have the function the same as the plurality of p-MOS transistors 44 and the plurality of p-MOS transistors 178 have the function the same as the plurality of p-MOS transistors 46. Each of the p-MOS transistors is current mirror-connected to the p-MOS transistor 118 of the mirror circuit 98 or the p-MOS transistor 126-0 of the second current dividing section 102 to receive the second base current or the third base current.

Then, the plurality of p-MOS transistors 176 and the plurality of p-MOS transistors 178 select to provide the base current received by each of the p-MOS transistors 174 to dummy transistor 50 or the converting transistor 52. Thereby the consumption current in the amplifying section is hold constant while the current according to the delay time setting can be applied to the converting transistor 52. Additionally, the coarse amplifying section 158 and the precise amplifying section 160 can provide the current being capable of changing with the resolution being a small current within the amplifying range of a large base current according to the delay time setting to the converting transistor 52.

Then, it is preferred that each magnitude of the base currents is previously initialized so as to achieve linearity of the gradations.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As described above, a delay circuit being compact and capable of accurately delaying a signal can be provided.

What is claimed is:

1. A delay circuit for delaying an input signal according to a desired delay time setting and outputting the same, comprising:
a delay element for delaying the input signal for a time period based on a given supply current and outputting the same;
a current supply section for generating the supply current;
a voltage generating section for generating a base voltage according to the delay time setting, the voltage generating section including:
a base current source for generating a plurality of base currents with different magnitude dependent on the resolution of the delay time setting; and
a current-voltage converting section for amplifying each of the base currents according to the delay time setting and generating the base voltage based on the sum of the amplified base currents, the current-voltage converting section including:
a plurality of delay amount converting current generating circuits for amplifying the base current with different amplifications from each other;
a selecting section for selecting one or more of the delay amount converting current generating circuits based on the delay time setting; and
a converter for generating the base voltage based on the sum of the current amplified by the delay amount converting current generating circuits selected by the selecting section,
each of the delay amount converting current generating circuits including:
a delay amount converting current path electrically connected to the converter; and
a dummy current circuit provided in parallel with the delay amount converting current path and not electrically connected to the converter,
wherein the selecting section applies the current amplified by the selected delay amount converting current generating circuit to the delay amount converting current path to cause the converter to provide the same, and applies the current amplified by the delay amount converting current generating circuits which are not selected to the dummy current path; and
a control section for converting the base voltage dependent on a characteristic of the current supply section and providing the same to the current supply section in order to cause the current supply section to generate the supply current.

2. The delay circuit according claim 1, wherein the current supply section has a predetermined conductivity, a first MOS transistor supplies a drain current to the delay element as the supply current, and the control section generates a first control voltage to operate the first MOS transistor in a saturation region and provides the first control voltage to a gate terminal of the first MOS transistor.

3. The delay circuit according to claim 2, wherein the control section includes a third MOS transistor for controlling the magnitude of a control current generated by the control section based on the base voltage, and the control section generates the first control voltage based on the control current.

4. The delay circuit according to claim 3, wherein the delay element is an inverter that charges/discharges an output capacity according to the input signal to delay the input signal and output the same, the first MOS transistor provides a charge current to the inverter to charge the output capacity of the inverter, the current supply section further includes a second MOS transistor for providing a discharge current to the inverter to discharge the output capacity of the inverter, and the control section generates a second control voltage to operate the second MOS transistor in the saturation region based on the control current and provides the same to the gate terminal of the second MOS transistor.

5. The delay circuit according to claim 4, wherein the first MOS transistor is a p-channel MOS transistor and the second MOS transistor is an n-channel MOS transistor, and a drain current of the first MOS transistor and the second MOS transistor is approximately the same when the same gate voltage and drain voltage are applied thereto.

6. The delay circuit according to claim 3, wherein the control current is applied to a drain terminal and the base current to control the control current is a gate terminal in the third MOS transistor, and the control section generates the first control voltage based on the potential difference between the drain terminal and the source terminal of the third MOS transistor, which is generated due to the control current.

7. The delay circuit according to claim 6, wherein the gate terminal of the third MOS transistor and the gate terminal of the first MOS transistor are electrically connected.

8. The delay circuit according to claim 7, wherein the control section further includes a fourth MOS transistor to whose source terminal the control current is applied, and the control section generates the second control voltage based on the potential difference between the drain terminal and the source terminal of the fourth MOS transistor, which is generated due to the control current.

9. The delay circuit according to claim 8, wherein the gate terminal of the fourth MOS transistor, the drain terminal of the fourth MOS transistor and the gate terminal of the second MOS transistor are electrically connected.

10. The delay circuit according to claim 9, wherein the fourth MOS transistor is a p-channel MOS transistor and the third MOS transistor is an n-channel transistor.

11. The delay circuit according to claim 10, wherein the offset current generating circuit causes the third MOS transistor and the fourth MOS transistor to operate in a linear region, and generates the offset current with enough magnitude to operate the first MOS transistor and the second MOS transistor in a saturation region.

12. The delay circuit according to claim 3, wherein the control current is applied to a drain terminal and the base current to control the control current is a gate terminal in the third MOS transistor, and the control section generates the second control voltage based on the potential difference between the drain terminal and the source terminal of the third MOS transistor, which is generated due to the control current.

13. The delay circuit according to claim 12, wherein the second MOS transistor and the third MOS transistor are current mirror-connected to each other, and the supply current with the magnitude dependent on the control current applied to the third MOS transistor is applied to the second MOS transistor.

14. The delay circuit according to claim 13, wherein the control section further includes a fourth MOS transistor to whose source terminal the control current is applied, and the control section generates the first control voltage based on the potential difference between the drain terminal and the source terminal of the fourth MOS transistor, which is generated due to the control current.

15. The delay circuit according to claim 14, wherein the first MOS transistor and the fourth MOS transistor are current mirror-connected to each other, and the supply current with the magnitude dependent on the control current applied to the fourth MOS transistor is applied to the first MOS transistor.

16. The delay circuit according to claim 15, wherein the fourth MOS transistor is a p-channel MOS transistor and the third MOS transistor is an n-MOS transistor.

17. The delay circuit according to claim 16, wherein the offset current generating circuit generates the offset current with enough magnitude to operate the first MOS transistor, the second MOS transistor, the third MOS transistor and the fourth MOS transistor in the saturation region within the delay time setting.

18. The delay circuit according to claim 2, wherein the current-voltage converting section further includes an offset current generating circuit for generating a predetermined offset current in order to operate the first MOS transistor in a saturation region, and the converter generates the base voltage further based on the offset current.

19. The delay circuit according to claim 18, wherein the current-voltage converting section amplifies the smallest one of the plurality of base currents based on the delay time setting, and the offset current generating circuit amplifies each of the plurality of base currents to generate the offset current.

20. The delay circuit according to claim 18, wherein the offset current generating circuit amplifies one or more of the base currents including at least the largest one of the plurality of currents to generate the offset current, and the current-voltage converting section amplifies one or more of the base currents including at least the smallest one of the base currents based on the delay time setting.

21. The delay circuit according to claim 1, wherein the base current source includes:
 a first reference current source for generating a first reference current with a predetermined magnitude;
 a second reference current source for generating a second reference current with a magnitude equal to the magnitude of the reference current divided by an integer; and
 a plurality of base current converting sections for generating the base currents with different magnitudes from each other based on the first reference current and the second reference current, each of the base current converting sections including:
  a first amplifying section for amplifying the magnitude of the first reference current by an integer multiple;
  a second amplifying section for amplifying the magnitude of the second reference current by an integer multiple; and
  a reference current combining section for generating the sum of the current amplified by the first amplifying section and the second amplifying section as the base current.

22. The delay circuit according to claim 1, wherein the base current source includes:
 a current source for generating a first base current with a predetermined magnitude; and
 a current dividing section for dividing the first base current into a plurality of transistors provided in parallel and generating a second base current with a magnitude equal to the magnitude of the first base current divided by an integer.

23. A testing apparatus for testing an electronic device comprising:
 a pattern generator for generating a test pattern for testing the electronic device;
 a waveform shaper for shaping the test pattern and providing the same to the electronic device; and
 a timing generator for controlling a timing at which the waveform shaper provides the test pattern to the electronic device,
 wherein the timing generator includes:
  a delay element for delaying a reference clock for a time period based on a given supply current, outputting the same to the waveform shaper and controlling a timing at which the test pattern is provided;
  a current supply section for generating the supply current;
  a voltage generating section for generating a base voltage dependent on the delay time setting, the voltage generating section including:
   a base current source for generating a plurality of base currents with different magnitude dependent on the resolution of the delay time setting; and
   a current-voltage converting section for amplifying each of the base currents according to the delay time setting and generating the base voltage based on the sum of the amplified base currents, the current-voltage converting section including:
a plurality of delay amount converting current generating circuits for amplifying the base current with different amplifications from each other;
a selecting section for selecting one or more of the delay amount converting current generating circuits based on the delay time setting; and
a converter for generating the base voltage based on the sum of the current amplified by the delay amount converting current generating circuits selected by the selecting section,
each of the delay amount converting current generating circuits including:
a delay amount converting current path electrically connected to the converter; and
a dummy current circuit provided in parallel with the delay amount converting current path and not electrically connected to the converter,
wherein the selecting section applies the current amplified by the selected delay amount converting current generating circuit to the delay amount converting current path to cause the converter to provide the same, and applies the current amplified by the delay amount converting current generating circuits which are not selected to the dummy current path; and
a control section for converting the base voltage to the control voltage dependent on a characteristic of the current supply section and providing the same to the current supply section in order to cause the current supply section to generate the supply current.

24. A delay circuit for delaying an input signal according to a desired delay time setting and outputting the same, comprising:
a delay element for delaying the input signal for a time period based on a given supply current and outputting the same;
a current supply section for generating the supply current;
a voltage generating section for generating a base voltage according to the delay time setting, the voltage generating section including:
a base current source for generating a plurality, of base currents with different magnitude dependent on the resolution of the delay time selling, the base current source including:
a first reference current source for generating a first reference current with a predetermined magnitude;
a second reference current source for generating a second reference current with a magnitude equal to the magnitude of the reference current divided by an integer; and
a plurality of base current converting sections for generating the base currents with different magnitudes from each other based on the first reference current and the second reference current, each of the base current converting sections including:
a first amplifying section for amplifying the magnitude of the first reference current by an integer multiple;
a second amplifying section for amplifying the magnitude of the second reference current by an integer multiple; and
a reference current combining section for generating the sum of the current amplified by the first amplifying section and the second amplifying section as the base current; and
a current-voltage converting section for amplifying each of the base currents according to the delay time setting and generating the base voltage based on the sum of the amplified base currents; and
a control section for converting the base voltage dependent on a characteristic of the current supply section and providing the same to the current supply section in order to cause the current supply section to generate the supply current.

25. A delay circuit for delaying an input signal according to a desired delay time setting and outputting the same, comprising:
a delay element for delaying the input signal for a time period based on a given supply current and outputting the same;
a current supply section for generating the supply current;
a voltage generating section for generating a base voltage according to the delay time setting, the voltage generating section including:
a base current source for generating a plurality of base currents with different magnitude dependent on the resolution of the delay time setting, the base current source including:
a current source for generating a first base current with a predetermined magnitude; and
a current dividing section for dividing the first base current into a plurality of transistors provided in parallel and generating a second base current with a magnitude equal to the magnitude of the first base current divided by an integer; and
a current-voltage converting section for amplifying each of the base currents according to the delay time setting and generating the base voltage based on the sum of the amplified base currents; and
a control section for converting the base voltage dependent on a characteristic of the current supply section and providing the same to the current supply section in order to cause the current supply section to generate the supply current.

26. A delay circuit for delaying an input signal according to a desired delay time setting and outputting the same, comprising:
a delay element for delaying the input signal for a time period based on a given supply current and outputting the same;
a current supply section with a predetermined conductivity for generating the supply current, wherein a first MOS transistor supplies a drain current to the delay element as the supply current;
a voltage generating section for generating a base voltage according to the delay time setting, the voltage generating section including:
a base current source for generating a plurality of base currents with different magnitude dependent on the resolution of the delay time setting; and
a current-voltage converting section for amplifying each of the base currents according to the delay time setting and generating the base voltage based on the sum of the amplified base currents, the current-voltage converting section including an offset current generating circuit for generating a predetermined offset current in order to operate the first MOS transistor in a saturation region; and
a control section for converting the base voltage dependent on a characteristic of the current supply section and providing the same to the current supply section in order to cause the current supply section to generate the supply current, wherein the control section generates a first control voltage to operate the first MOS transistor in a saturation region and provides the first control voltage to a gate terminal of the first MOS transistor, wherein the current-voltage converting section amplifies the smallest one of the plurality of base currents based on the delay time setting, and the offset current generating circuit amplifies each of the plurality of base currents to generate the offset.

27. A delay circuit for delaying an input signal according to a desired delay time setting and outputting the same, comprising:

a delay element for delaying the input signal for a time period based on a given supply current and outputting the same;

a current supply section with a predetermined conductivity for generating the supply current, wherein a first MOS transistor supplies a drain current to the delay element as the supply current;

a voltage generating section for generating a base voltage according to the delay time setting, the voltage generating section including:

a base current source for generating a plurality of base currents with different magnitude dependent on the resolution of the delay time setting; and a current-voltage converting section for amplifying each of the base currents according to the delay time setting and generating the base voltage based on the sum of the amplified base currents, the current-voltage converting section including an offset current generating circuit for generating a predetermined offset current in order to operate the first MOS transistor in a saturation region; and a control section for converting the base voltage dependent on a characteristic of the current supply section and providing the same to the current supply section in order to cause the current supply section to generate the supply current wherein the control section generates a first control voltage to operate the first MOS transistor in a saturation region and provides the first control voltage to a gate terminal of the first MOS transistor, wherein the offset current generating circuit amplifies one or more of the base currents including at least the largest one of the plurality of currents to generate the offset current, and the current-voltage converting section amplifies one or more of the base currents including at least the smallest one of the base currents based on the delay time setting.

* * * * *

UNITED STATES PATENT AND TRADEMARK OFFICE
CERTIFICATE OF CORRECTION

PATENT NO. : 7,511,547 B2
APPLICATION NO. : 11/446855
DATED : March 31, 2009
INVENTOR(S) : Masakatsu Suda et al.

It is certified that error appears in the above-identified patent and that said Letters Patent is hereby corrected as shown below:

In the Claims:

In Claim 6, column 20, line 65, "claim 3" should be --claim 18--.

In Claim 18, column 21, line 62, "claim 2" should be --claim 4--.

In Claim 12, column 21, line 8, "claim 7" should be --claim 18--.

In Claim 17, column 21, line 35, "claim 12" should be --claim 14--.

Signed and Sealed this

Twenty-eighth Day of July, 2009

JOHN DOLL
*Acting Director of the United States Patent and Trademark Office*